(12) United States Patent
Tobita

(10) Patent No.: US 7,893,732 B2
(45) Date of Patent: Feb. 22, 2011

(54) DRIVER CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 159 days.

(21) Appl. No.: 12/403,007

(22) Filed: Mar. 12, 2009

(65) Prior Publication Data

US 2009/0231015 A1    Sep. 17, 2009

(30) Foreign Application Priority Data

Mar. 13, 2008   (JP) ............................. 2008-063557

(51) Int. Cl.
*H03K 3/00* (2006.01)
(52) U.S. Cl. ..................................... 327/108
(58) Field of Classification Search ................ None
See application file for complete search history.

(56) References Cited

U.S. PATENT DOCUMENTS

| | | | |
|---|---|---|---|
| 3,506,851 A | | 4/1970 | Polkinghorn et al. |
| 3,710,271 A | * | 1/1973 | Putnam ........................ 326/88 |
| 4,431,927 A | | 2/1984 | Eaton, Jr. et al. |
| 4,680,488 A | | 7/1987 | Okumura et al. |
| 4,697,111 A | | 9/1987 | Van Zanten et al. |

FOREIGN PATENT DOCUMENTS

| | | |
|---|---|---|
| JP | 52-116059 | 9/1977 |
| JP | 58-215823 | 12/1983 |

OTHER PUBLICATIONS

Won-Kyu Lee, et al., "P-13: Low-Power a-Si Level Shifter for Mobile Displays with Bootstrapped Capacitor and Pulsed Signal Source", SID 07 Digest, pp. 218-221.

* cited by examiner

*Primary Examiner*—Lincoln Donovan
*Assistant Examiner*—Khareem E Almo
(74) *Attorney, Agent, or Firm*—Oblon, Spivak, McClelland, Maier & Neustadt, L.L.P.

(57) ABSTRACT

An object is to provide a driver circuit as well as a level converting circuit, capable of reducing current consumption and accelerating an operation, and in the driver circuit that changes a voltage level of an output signal in correspondence with a change in voltage level of an input signal, when a transistor is turned on and a voltage level of an output signal changes, a positive feedback operation of raising a voltage of an output node of an input stage circuit that drives the transistor is performed, whereby a gate-source voltage of the transistor increases while an on-resistance thereof decreases, and a change in voltage level of the output node in the positive feedback operation is accelerated due to a bootstrap action in the input stage circuit.

26 Claims, 17 Drawing Sheets

F I G . 1
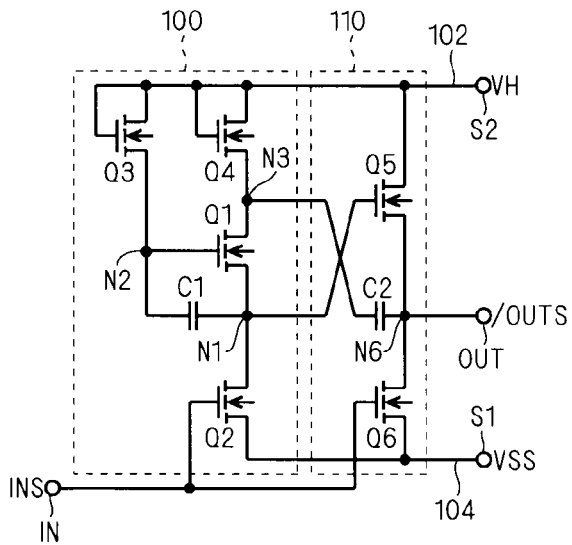
F I G . 2
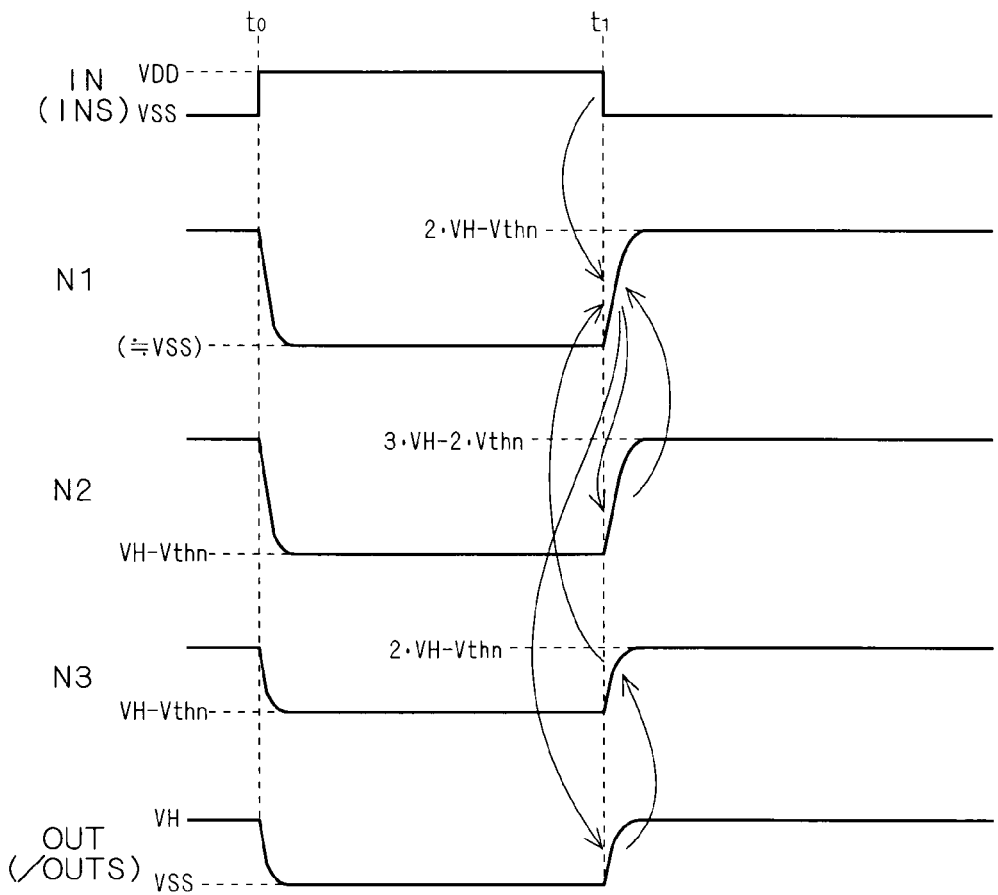

F I G . 3
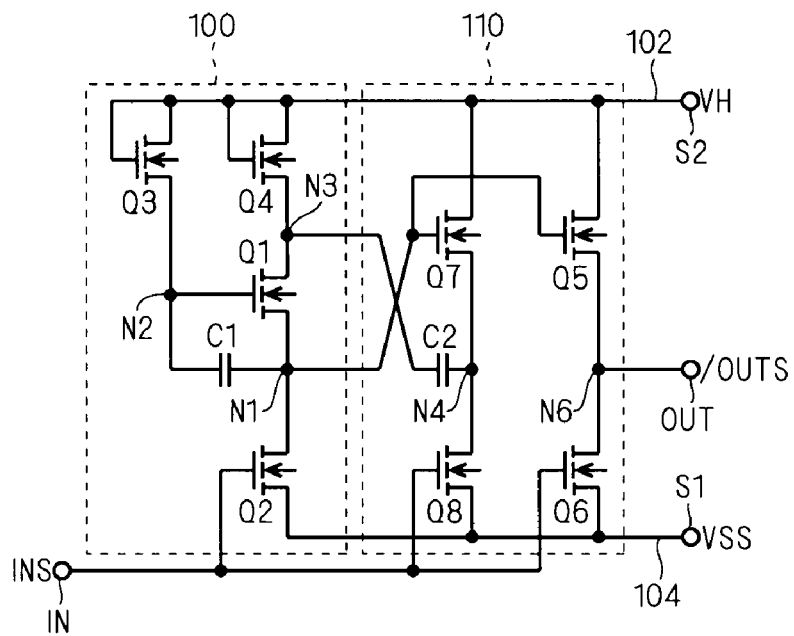
F I G . 4
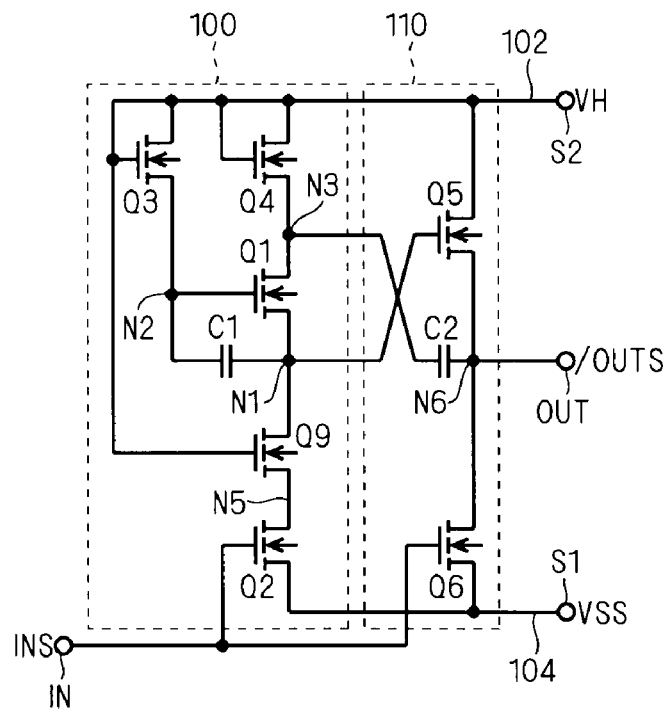

F I G. 7
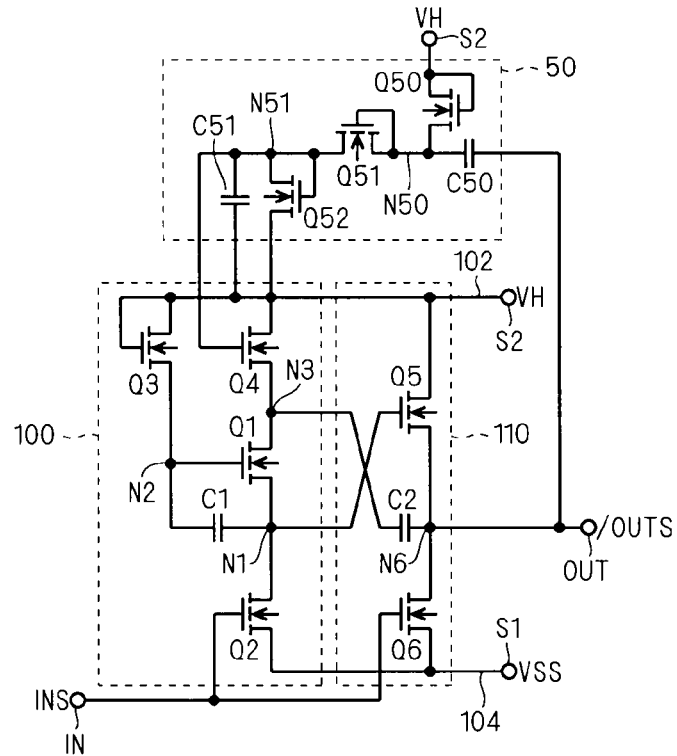
F I G. 8
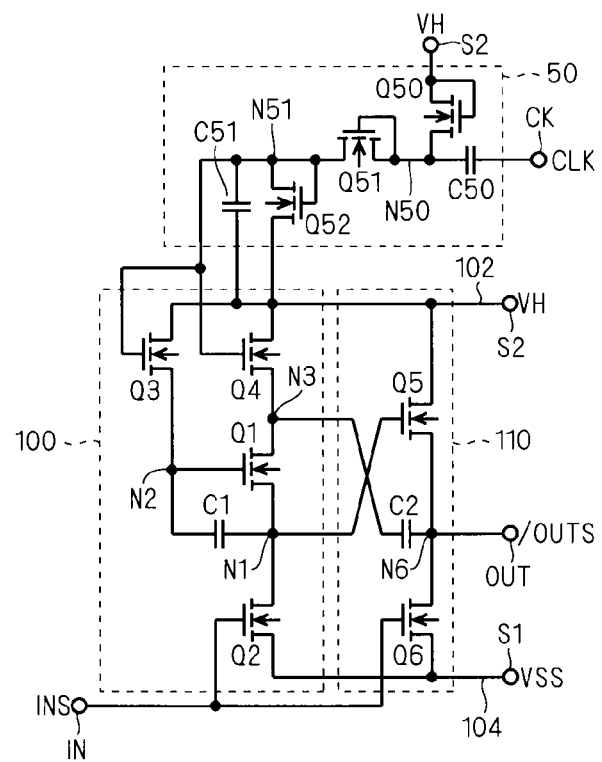

F I G . 9
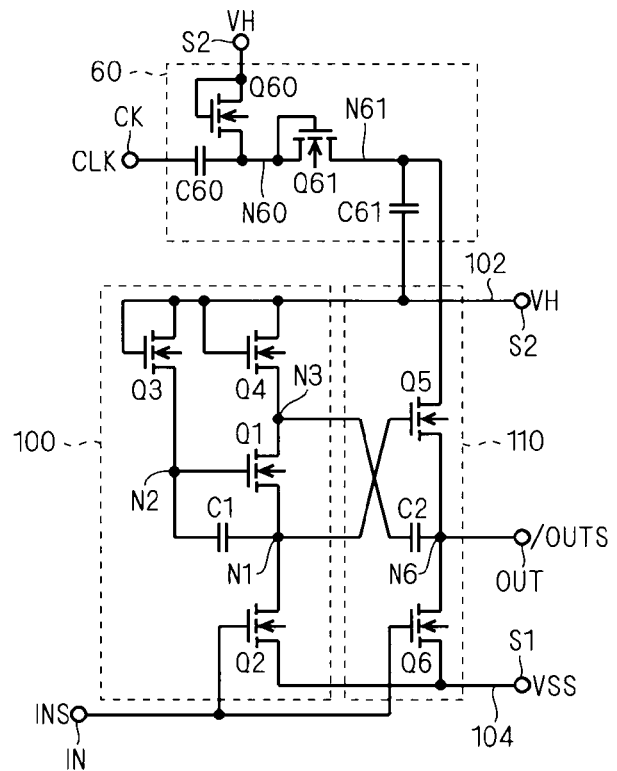
F I G . 1 0
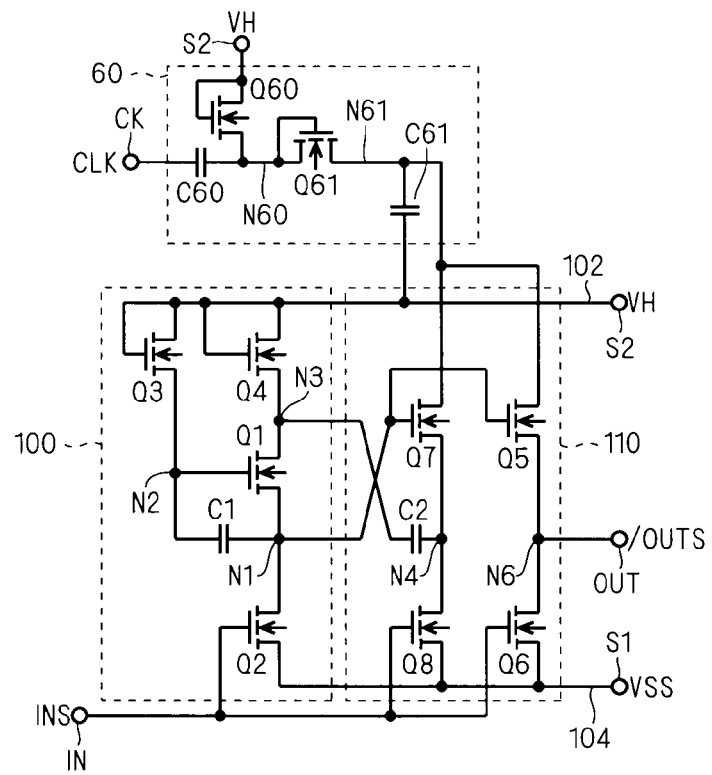

F I G. 1 1
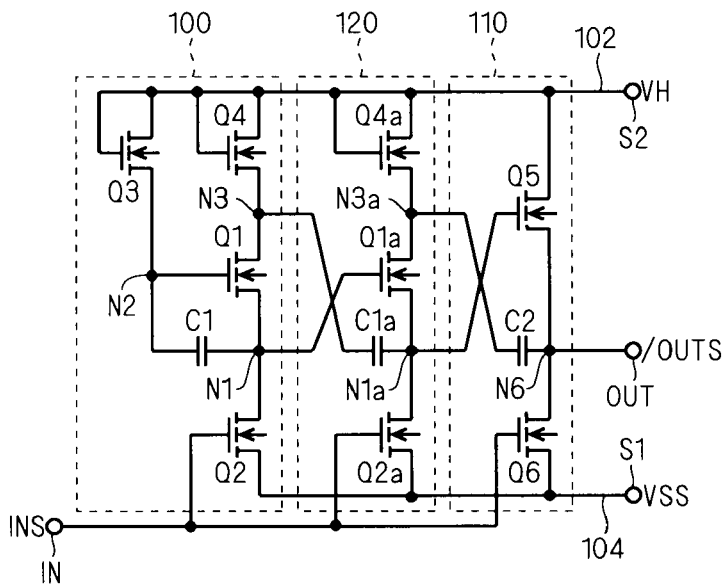
F I G. 1 2
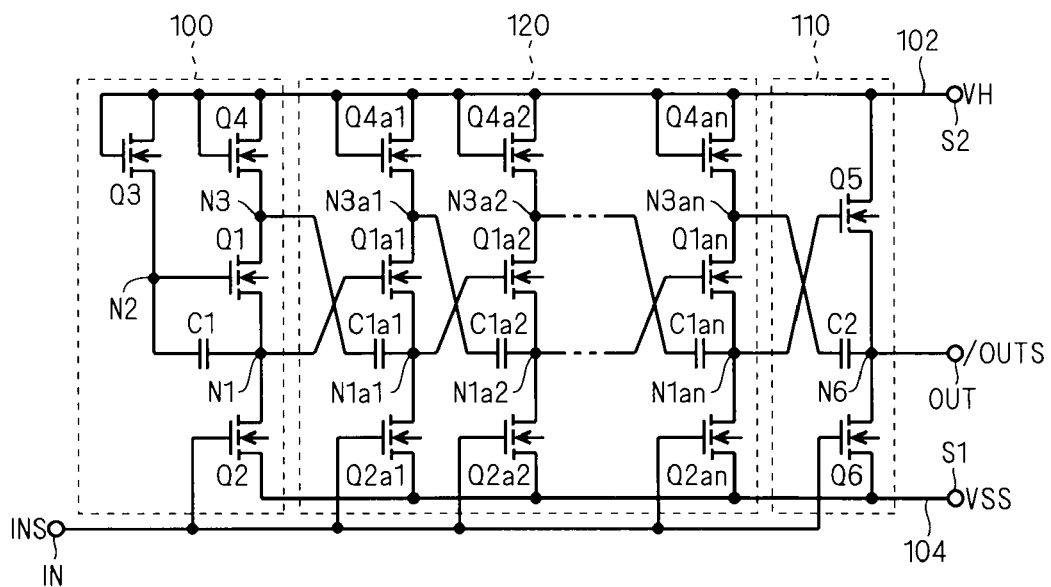

F I G . 1 3
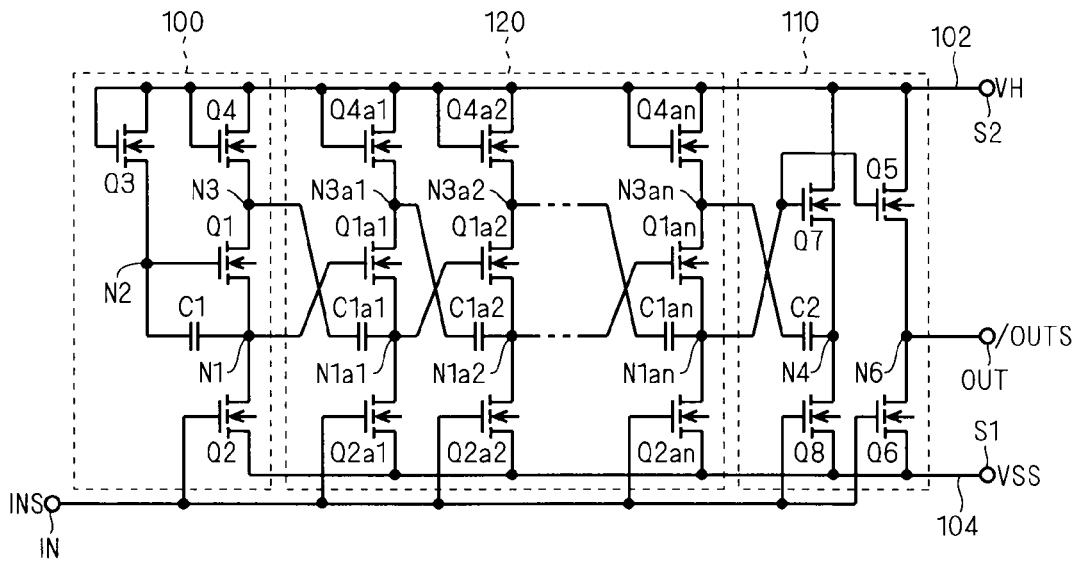
F I G . 1 4
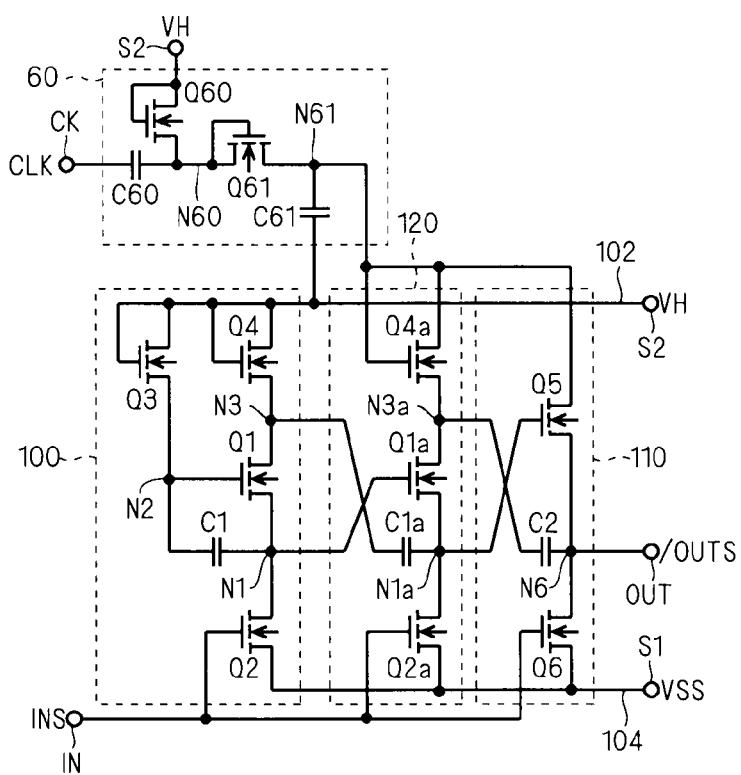

F I G . 1 5
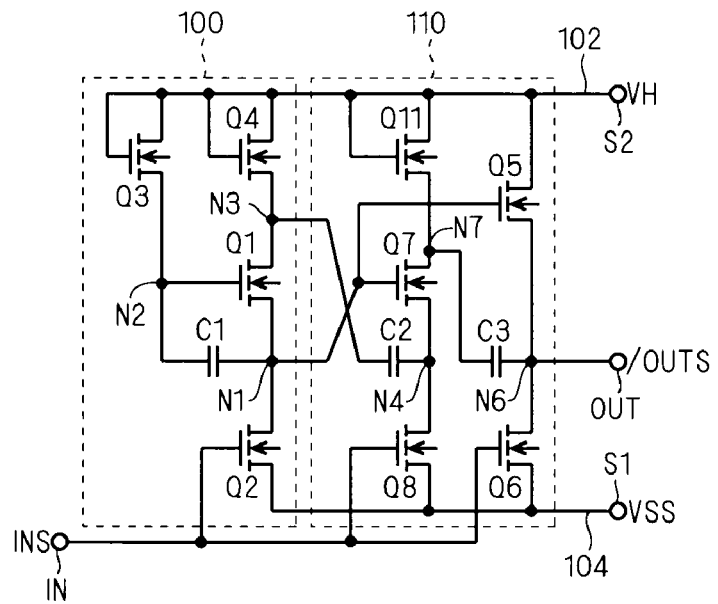
F I G . 1 6
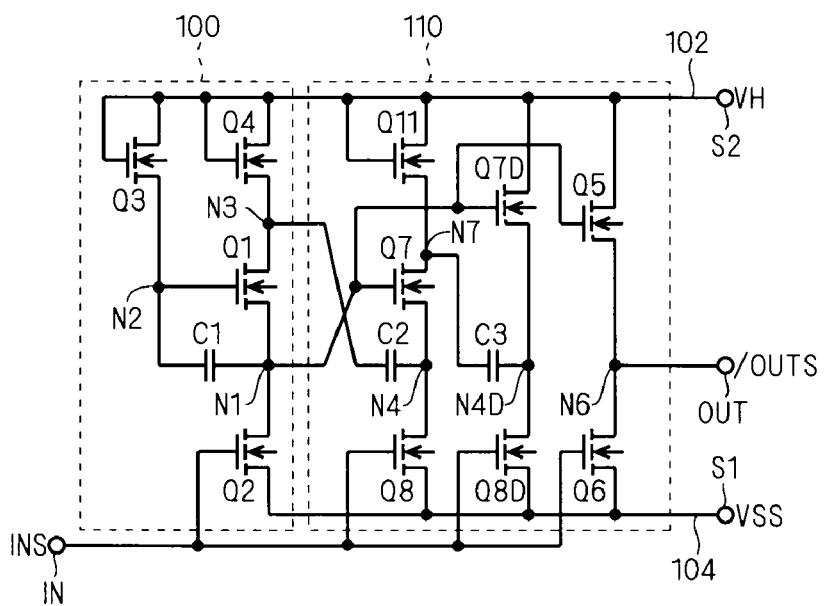

F I G . 2 8
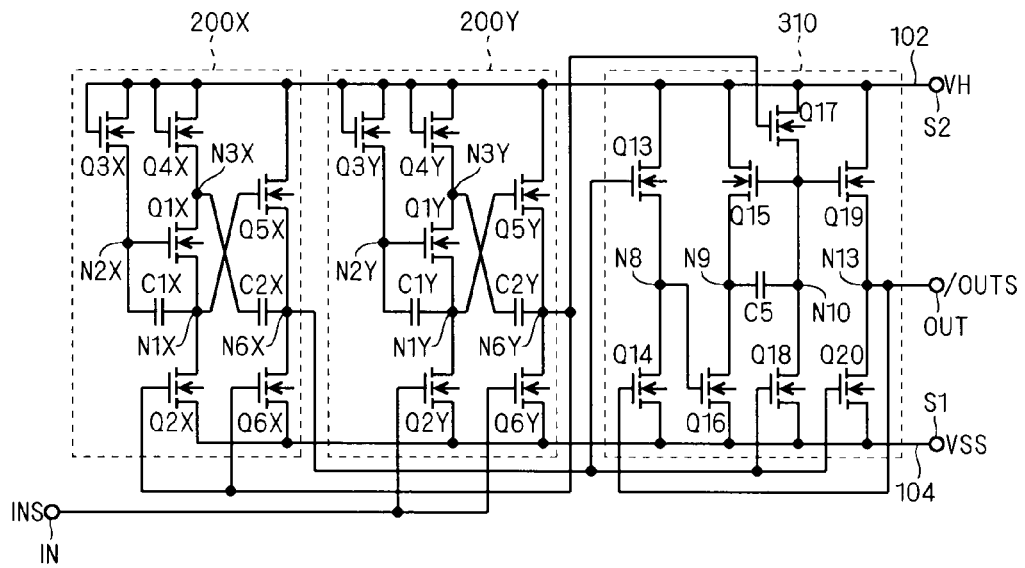
F I G . 2 9
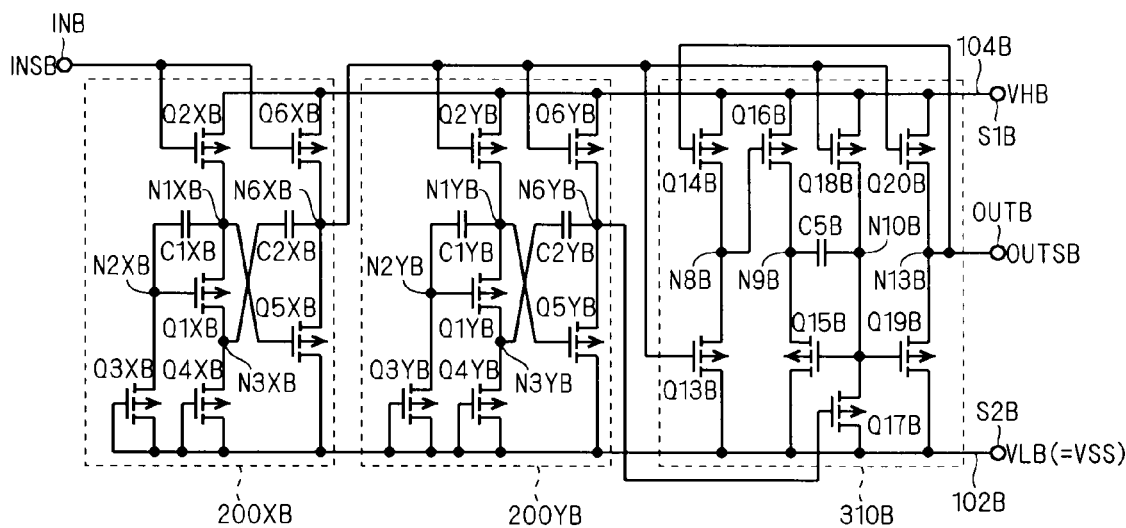

DRIVER CIRCUIT

BACKGROUND OF THE INVENTION

1. Field of the Invention

The present invention relates to a driver circuit, and particularly relates to a driver circuit made up of transistors all being an identical conductive type. Further, the driver circuit according to the present invention also includes a function as a level converting circuit.

2. Description of the Background Art

A driver circuit that drives a capacitive load (load capacitance) is widely known, and for example, a driver circuit made up transistors all being an identical conductive type, namely a driver circuit configured only using transistors of the same conductive type is disclosed in U.S. Pat. No. 3,506,851, Japanese Patent Application Laid-Open No S52-116059, and "Low-Power a-Si Level Shifter for Mobile Displays with Bootstrapped Capacitor and Pulsed Signal Source" (written by Won-Kyu Lee, et al., SID 07 DIGEST, pp. 218-221). The driver circuit made up only of transistors of the same conductive type is advantageous in being capable of seeking simplification of a manufacturing process and reduction in manufacturing cost due to the simplification.

For example, FIG. 2 of U.S. Pat. No. 3,506,851 discloses a driver circuit configured only using p-type MOS transistors. This driver circuit has a bootstrap circuit (bootstrap inverter), made up of three transistors (5, 7, 12) and a capacitive element (C) being a feedback capacitance, as an input stage and a push-pull circuit made up of p-type MOS transistors (17, 18) as an output stage.

The push-pull circuit is made up of the two transistors (17, 18) series-connected between a high-side power source (ground voltage) and a low-side power source (−V), and a connection node therebetween is used as an output terminal of the driver circuit. Namely, out of those two transistors, the one transistor (17) serves to supply the output terminal with a low (L) level voltage (voltage −V), and the other transistor (18) serves to supply the output terminal with a high (H) level voltage (ground voltage).

The two transistors (17, 18) of the push-pull circuit are controlled so as to be mutually complementarily (alternately) turned on, and in a steady state, a direct current (through current from the high-side power source to the low-side power source) does not flow through those two transistors. It is thus possible by the driver circuit having the push-pull circuit as the output stage to seek improvement in driving ability (current driving force) of the driver circuit while seeking reduction in power consumption thereof.

The bootstrap circuit as the input stage of the driver circuit of FIG. 2 of U.S. Pat. No. 3,506,851 drives the above-mentioned one transistor (17) (hereinafter referred to as "transistor 17"). For example, in setting an output signal (OUTPUT) of the driver circuit at an L-level, this bootstrap circuit lowers a gate voltage of the transistor 17 to the low-side power voltage (−V), to turn on the transistor 17. When the transistor 17 is turned on, the output terminal is discharged, to be set at the L-level.

However, since the transistor 17 operates in a saturated region at this time, the L-level voltage of its output signal becomes a voltage (−V+Vth) obtained by superimposing a voltage corresponding to a threshold voltage (Vth) of the transistor 17 on the low-side power voltage (−V). Namely, there is a problem with the driver circuit of FIG. 2 of U.S. Pat. No. 3,506,851 in that a loss corresponding to the threshold voltage of the transistor 17 occurs in the L-level voltage of the output signal.

Further, since a source of the transistor 17 is connected to the output terminal, in discharging the output terminal to be set at the L-level, the transistor 17 performs a source follower operation in the saturated region. Namely, as the output terminal approaches an ultimate L-level voltage (−V+Vth), a gate-source voltage difference of the transistor 17 approaches the threshold voltage (Vth). That is, the more the output terminal approaches the ultimate L-level voltage (−V+Vth), the higher an on-resistance value of the transistor 17 becomes. This causes a decrease in falling speed of the output signal, to hinder an accelerated operation.

A driver circuit of FIG. 3 of U.S. Pat. No. 3,506,851 seeks improvement in the above problem. In this driver circuit, a circuit for an input stage that drives a transistor (26) (hereinafter referred to as "transistor 26") for setting the output terminal at the L-level is not a bootstrap circuit, but a normal ratio-type inverter (transistors 21, 27), provided that a capacitive element (C) is connected as a feedback capacitance between the output terminal and a gate of the transistor 26, and a delay capacitive element (Cd) for delaying the falling timing of an output signal (OUTPUT) is further connected to the output terminal.

In turning on the transistor 26 to set an output signal (OUTPUT) of the driver circuit at the L-level, the ratio-type inverter does not lower a gate voltage of the transistor 26 to the low-side power voltage (−V). Namely, the ratio-type inverter is only capable of lowering the gate voltage of the transistor 26 to the voltage (−V+Vth) obtained by superimposing a voltage corresponding to a threshold voltage (Vth) of the transistor 26 on the low-side power voltage (−V).

However, immediately thereafter, a voltage change of an output signal that trails down after a delay due to an action of the delay capacitive element (Cd) is transmitted to the gate voltage of the transistor 26 through the feedback capacitance (C), and the gate voltage further falls. As a consequence, the gate voltage of the transistor 26 becomes lower than −V+Vth, the transistor 26 operates in a non-saturated region, and the L-level of the output signal becomes equivalent to the low-side power voltage (−V). Namely, the above-mentioned problem of occurrence of a loss corresponding to the threshold voltage Vth of the transistor in the L-level voltage of the output signal is solved.

Further, since the gate voltage of the transistor 26 is set to a sufficiently low value, even when the output terminal approaches the ultimate L-level voltage (−V), the gate-source voltage can be held large. Accordingly, the problem of the decrease in falling speed of the output signal can be improved as compared with FIG. 2 of U.S. Pat. No. 3,506,851.

It is to be noted that a driver circuit of FIG. 4 of U.S. Pat. No. 3,506,851 functions in a manner similar to the circuit of FIG. 3. In the circuit of FIG. 3, the delay capacitive element (Cd) was provided in the output terminal with an aim to delay the falling timing of the output signal. As opposed to this, in the circuit of FIG. 4, a delay capacitive element is provided in a gate of a transistor (30) for setting the output signal (OUTPUT) at the H-level in order to achieve the same aim as in FIG. 3. Namely, in the circuit of FIG. 4, the falling timing of the output signal is delayed by delaying the timing for turning off the transistor 30 for setting the output signal at the H-level. Since operations other than that are basically the same as those of the circuit of FIG. 3, this circuit also solves the problem of occurrence of a loss in the L-level voltage of the output signal as well as the problem of the decrease in falling speed of the output signal.

As thus described, in the driver circuit shown in FIG. 2 of U.S. Pat. No. 3,506,851 which is made up of the bootstrap circuit and the push-pull circuit, a loss corresponding to the threshold voltage of the transistor 17 occurs in the output-level voltage. Further, the driver circuit also has the problem of the decrease in falling speed of the output signal.

In the circuits of FIGS. 3 and 4 of U.S. Pat. No. 3,506,851, although those problems are improved, there is still room for further improvement in terms of the falling speed of the output signal. For example, in the circuit of FIG. 3, the transistor 26 is driven by the normal ratio-type inverter, but the transistor (27) that sets the gate of the transistor 26 at the L-level for turning on the transistor 26 performs the source follower operation in the saturated region. Hence it is considered that sufficiently lowering the resistance of the transistor 26 requires time, thereby decreasing the falling speed of the output signal.

Further, the output terminal is connected with the delay capacitive element (Cd) for delaying the falling timing of the output signal, and it is considered that charging the element requires time depending upon its capacitance value, thereby decreasing the falling speed of the output signal. In this case, the operation of feeding back the voltage change of the output signal to the gate voltage of the transistor 26 through the delay capacitive element (Cd) also becomes slow, leading to reduction in effect of the improvement in falling speed of the output signal.

SUMMARY OF THE INVENTION

An object of the present invention is to provide a driver circuit as well as a level converting circuit, which is configured only using transistors of the same conductive type, and does not involve a loss corresponding to a threshold voltage of a transistor at an active level of an output signal, thus being capable of reducing power consumption and accelerating an operation.

The driver circuit according to the present invention includes: a first power source and a second power source; an input terminal which receives an input signal; an output terminal from which an output signal is outputted; first to fourth transistors of a predetermined conductive type; first and second unilateral current driving elements; and a push-pull circuit.

The first transistor is connected between the first power source and a predetermined first node, and has a gate connected to the input terminal. The second transistor is connected between the first node and a predetermined second node. The first unilateral current driving element is connected at its one end to a third node connected with a gate of the second transistor, and supplies the third node with a voltage for bringing the second transistor into an on-state. The second unilateral current driving element is connected at its one end to the second node. The first capacitive element is connected between the first node and the third node. The third transistor is connected between the first power source and the output terminal, and has a gate connected to the input terminal. The fourth transistor is connected between the second power source or a voltage generating circuit for generating an active-level voltage and the output terminal.

The push-pull circuit transmits a voltage signal of the first node to a gate of the fourth transistor. A pull-up transistor that shifts the gate of the fourth transistor to the active level in the push-pull circuit has a higher driving ability than the second transistor.

The second unilateral current driving element previously supplies the second node with a predetermined voltage such that a voltage for turning on the fourth transistor is supplied to the first node through the second transistor when the first transistor is turned off.

The driver circuit is configured such that a voltage change of the second node occurs in correspondence with a voltage change of the output terminal when the fourth transistor is turned on, and a gate-source voltage of the fourth transistor is further increased due to a voltage change of the first node caused by this voltage change of the second node.

According to the present invention, when the fourth transistor that activates an output signal of the level converting circuit is turned on, a change in voltage level of the output signal is positively fed back to the gate voltage of the fourth transistor. This can reduce an on-resistance of the fourth transistor, thereby to increase activation speed of the output signal. Further, since the fourth transistor operates in a non-saturated region the voltage at the active level of the output signal does not involve a loss corresponding to a threshold voltage of the transistor.

Further, in the above-mentioned positive feedback operation, an on-resistance of the second transistor also decreases due to a bootstrap action through the first capacitive element. Hence a level of the first node also changes at high speed, and this can also contribute to an increase in activation speed of the output signal.

Moreover, since the gate of the fourth transistor is supplied with the voltage signal of the first node through the push-pull circuit having a high driving ability, even when a current flowing through the first transistor is small, it is possible to shift the gate of the fourth transistor to the active level at high speed. It is therefore possible to seek an increase in rising speed of the output signal while suppressing power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of a driver circuit according to Embodiment 1.

FIG. 2 is a signal waveform diagram showing an operation of a driver circuit according to Embodiment 1.

FIG. 3 is a circuit diagram showing a first modified example of the driver circuit according to Embodiment 1.

FIG. 4 is a circuit diagram showing a second modified example of the driver circuit according to Embodiment 1.

FIG. 7 is a circuit diagram showing a fifth modified example of the driver circuit according to Embodiment 1.

FIG. 8 is a circuit diagram showing a sixth modified example of the driver circuit according to Embodiment 1.

FIG. 9 is a circuit diagram showing a seventh modified example of the driver circuit according to Embodiment 1.

FIG. 10 is a circuit diagram showing an eighth modified example of the driver circuit according to Embodiment 1.

FIG. 11 is a circuit diagram showing a ninth modified example of the driver circuit according to Embodiment 1.

FIG. 12 is a circuit diagram showing a tenth modified example of the driver circuit according to Embodiment 1.

FIG. 13 is a circuit diagram showing an eleventh modified example of the driver circuit according to Embodiment 1.

FIG. 14 is a circuit diagram showing a twelfth modified example of the driver circuit according to Embodiment 1.

FIG. 15 is a circuit diagram showing a thirteenth modified example of the driver circuit according to Embodiment 1.

FIG. 16 is a circuit diagram showing a fourteenth modified example of the driver circuit according to Embodiment 1.

FIG. 28 is a circuit diagram showing a third modified example of the driver circuit according to Embodiment 5.

FIG. 29 is a circuit diagram showing a configuration of a driver circuit according to Embodiment 6.

DESCRIPTION OF THE PREFERRED EMBODIMENTS

Figure 5:
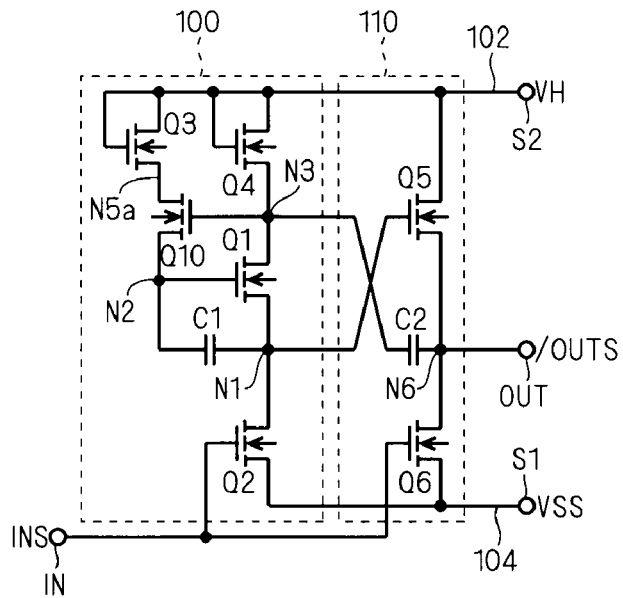
FIG. 5 is a circuit diagram showing a third modified example of the driver circuit according to Embodiment 1.

In the following, an embodiment of the present invention is described with reference to drawings. It is to be noted that in order to avoid redundancy due to duplicate descriptions, elements identical or corresponding to each other are provided with the same numeral in the respective drawings.

Further, transistors used in each embodiment are insulating gate-type field-effect transistors. In each insulating gate-type field-effect transistor, electric conductivity between a drain region and a source region is controlled by an electric field in a gate insulating film. As a material for the semiconductor layer where the drain region and the source region are formed, polysilicon, amorphous silicon or an organic semiconductor such as pentacene, a monocrystalline silicone, compound semiconductor such as ZnO, or the like are usable.

As well known, a transistor is an element having at least three electrodes including a control electrode [gate (electrode) in a narrow sense], one current electrode [drain (electrode) or source (electrode) in a narrow sense], and the other current electrode [source (electrode) or drain (electrode) in a narrow sense]. The transistor applies a predetermined voltage to the gate, to function as a switching element with its channel formed between the drain and the source. The drain and the source of the transistor basically have the identical configuration, and the address terms thereof are interchanged with each other depending upon the condition of the applied voltage. For example, in the case of an n-type transistor, an electrode having a relatively higher potential is referred to as the drain while an electrode having a lower potential is as the source (those are opposite in the case of a p-type transistor).

So long as not particularly indicated, those transistors may be formed on a semiconductor substrate, or may be thin film transistors (TFT) formed on an insulating substrate such as glass. As the substrate where the transistor is formed, a monocrystalline substrate or an insulating substrate made of SOI, glass, a resin or the like may be used.

The driver circuit as well as a level converting circuit according to the present invention is configured using only transistors of the same conductive type. For example, an n-type transistor comes into an active state (on-state, conduction state) when the gate shifts to a high (H) level with respect to the source, and comes into a non-active state (off-state, non-conduction state) when the gate shifts to a low (L) level. Therefore, in the present specification, in an embodiment using the n-type transistors, the H-level of a signal is described as an "active level", and the L-level as a "non-active level". Namely, each node of a circuit configured using the n-type transistors shifts from the non-active level to the active level by being charged, and shifts from the active level to the non-active level by being discharged.

On the other hand, the p-type transistor comes into the active state when the gate shifts to the L-level with respect to the source, and comes into the non-active state when the gate shifts to the H-level, and hence in an embodiment using the p-type transistors, the L-level of a signal is described as the "active level", and the H-level as the "non-active level". Namely, each node of a circuit configured using the p-type transistors shifts from the active level to the non-active level by being charged, and shifts from the non-active level to the active level by being discharged.

Further, in the present specification, "connection" between two elements, between two nodes, or between one element and one node is described as connection including a state where connection is made through another component (element, switch, etc.), but is practically equivalent to direct connection. For example, even in a case where two elements are connected through a switch, when those can function identically to the case of those being directly connected, it is expressed that those two elements are "connected".

Embodiment 1

FIG. 1 is a diagram showing a configuration of a driver circuit according to Embodiment 1 of the present invention. The driver circuit is configured only using n-type transistors, and made up of an input stage circuit 100 and an output stage circuit 110. An input signal INS is inputted into an input terminal IN of the input stage circuit 100, and an output signal /OUTS obtained by reversing a logic level (H-level, L-level) of the input signal INS is outputted from an output terminal OUT provided in the output stage circuit 110.

This driver circuit is supplied with a voltage VH as a high-side power source and a voltage VSS as a low-side power source. The high-side power voltage VH is a positive voltage higher than a reference voltage GND as a reference level of a voltage of each signal. Typically, the reference voltage GND is a ground potential (0V). Further, the low-side power voltage VSS may be a voltage at the same voltage level (potential) as the reference voltage GND, or may be a negative voltage lower than that.

The driver circuit is capable of outputting, as the output signal /OUTS, a voltage signal with the high-side power voltage VH at the H-level and the low-side power voltage VSS at the L-level. On the other hand, the input signal INS is assumed to be a voltage signal with a voltage VDD at the H-level and the voltage VSS at the L-level. The voltage VDD may be at a level higher to some degree than threshold voltages of transistors Q2, Q6. In addition, the voltage VDD may be the same voltage as the above-mentioned high-side power voltage VH.

When the H-level voltage VDD of the input signal INS is lower than the H-level voltage VH of the output signal /OUTS, the driver circuit operates as a level converting circuit for converting the input signal INS having the relatively low H-level voltage (VDD) into the output signal/OUTS having an H-level voltage (VH) higher than the voltage (VDD). As thus described, the driver circuit according to the present invention also functions as the level converting circuit, but it makes no difference in the ability to drive a load capacitance, the circuit is referred to as "driver circuit" regardless of its use in each of the following embodiments.

In the following embodiment, a description is given assuming that the H-level voltage VDD of the input signal INS is lower than the H-level voltage VH of the output signal/OUTS, and the driver circuit also functions as the level converting circuit. Further, for the sake of simplification, it is assumed that the low-side power voltage VSS is at the same level as the reference voltage GND (=0V). Moreover, threshold voltages of the respective n-type transistors constituting the driver circuit are all equivalent, and the value thereof is referred to as Vthn.

With reference to FIG. 1 once again, the configuration of the driver circuit according to the present embodiment is described. As described above, the driver circuit is made up of the input stage circuit 100 and the output stage circuit 110. Each of those circuits is supplied with a power source from a high-side power line 102 and a low-side power line 104. The high-side power line 102 is supplied with the voltage VH through a high-side power node S2, and the low-side power line 104 is supplied with the voltage VSS through a low-side power node S1.

The input stage circuit 100 is a bootstrap circuit, and configured of n-type transistors Q1 to Q4 and a capacitive element C1. In the input stage circuit 100, the transistors Q4, Q1, Q2 are serial-connected in this order between the high-side power line 102 and the low-side power line 104. Here, as in FIG. 1, a connection node between the transistor Q1 and the transistor Q2 is defined as a node N1, a node connected with a gate of the transistor Q1 is defined as a node N2, and a connection node between the transistor Q4 and the transistor Q1 is defined as a node N3.

Namely, the transistor Q4 is connected between the high-side power line 102 and the node N3, the transistor Q1 is connected between the node N3 and the node N1, and the transistor Q2 is connected between the node N1 and the low-side power line 104. A gate of the transistor Q4 is connected to the high-side power line 102 (namely, the transistor Q4 is diode-connected). The capacitive element C1 as a feedback capacitance is connected between the gate of the transistor Q1 (node N2) and the node N1, and further, the transistor Q3 with its gate connected to the high-side power line 102 is connected between the node N2 and the high-side power line 102 (namely, the transistor Q3 is diode-connected). A gate of the transistor Q2 is an input node of the driver circuit, and connected to the input terminal IN that receives the input signal INS. An output node of the input stage circuit 100 is the node N1.

A circuit made up of the transistors Q1, Q2 constitute a ratio-type inverter with the input terminal IN used as an input node and with the node N1 used as an output node. Namely, in the inverter, the transistor Q1 is a load element (load transistor), the transistor Q2 is a drive element (drive transistor), and a signal obtained by reversing the logic level of the input signal INS is outputted to the node N1. Respective on-resistances of the load transistor Q1 and the drive transistor Q2 are set at an appropriate ratio so that a signal at a predetermined level is obtained at the node N1.

The output stage circuit 110 has a push-pull circuit made up of the transistors Q5, Q6 serial-connected between the high-side power line 102 and the low-side power line 104. When a connection node therebetween is defined as a node N6, the transistor Q5 is connected between the high-side power line 102 and the node N6, and its gate is connected to the node N1. The transistor Q6 is connected between the node N6 and the low-side power line 104, and its gate is connected to the input terminal IN. The node N6 is an output node of the push-pull circuit made up of the transistors Q5, Q6, as well as the output terminal OUT of the driver circuit.

The output stage circuit 110 further has a capacitive element C2 connected between the node N6 and the node N3. This capacitive element C2 capacitively couples the node N6 (output terminal OUT) and the node N3, and changes a voltage level of the node N3 in correspondence with a change in voltage level of the node N6.

As thus described, with the operation of the inverter made up of the transistors Q1, Q2, the input signal INS and a signal of the node N1 come into the relationship in which the logic levels thereof are reversed, and hence the transistor Q5 controlled by the signal of the node N1 and the transistor Q6 controlled by the input signal INS are complementarily (alternately) turned on. With the transistors Q5, Q6 controlled in such a manner, the push-pull circuit made up thereof performs a predetermined operation not accompanied by a direct current.

The diode-connected transistor Q3 passes a current only in a direction from the high-side power line 102 toward the node N2, namely, acts as a unilateral current drive element taking the above-mentioned direction as a forward direction. It is to be noted that the unilateral current driving element in the present specification includes not only an element flowing no backward current, but an element flowing a backward current so small with respect to the forward current as to be ignored.

Since the voltage of the high-side power line 102 is VH, when the transistor Q3 is turned on, the node N2 is charged to the voltage VH-Vthn (this Vthn is a threshold voltage of the transistor Q3). The high-side power voltage VH is set such that the value of this VH-Vthn is higher than the threshold voltage of the transistor Q1. Namely, the transistor Q1 is in the on-state when the voltage of the node N2 is the voltage VH-Vthn.

In the circuit of FIG. 1, although the transistor Q3 is diode-connected between the high-side power line 102 and the node N2, it may not have this connecting configuration so long as being able to function as the unilateral current drive element capable of charging the node N2 to turn on the transistor Q1 in a manner similar to above. For example, a connecting destination of a drain and a gate of the transistor Q3 may be another voltage source that supplies a different voltage from the voltage VH, or may be a repeat signal source (alternate signal source) as in FIG. 1B of "Low-Power a-Si Level Shifter for Mobile Displays with Bootstrapped Capacitor and Pulsed Signal Source" mentioned above as the non-patent document.

The transistor Q4 acts as a unilateral current drive element taking the direction from the high-side power line 102 to the node N3 as a forward direction, and when turned on, the transistor Q4 charges the node N3 to the voltage VH-Vthn (this Vthn is the threshold voltage of the transistor Q3). By charging the node N3, the transistor Q4 supplies the inverter made up of the transistors Q1, Q2 with a high-side power source.

FIG. 2 is a signal waveform diagram showing an operation of the driver circuit (FIG. 1) of the present embodiment. With reference to FIG. 2, the operation of the driver circuit shown in FIG. 1 is described. It is to be noted that in the following description, so long as not particularly indicated, an influence upon a voltage level of each node caused by a parasitic capacitance and a current driving force (or on-resistance) of the transistor is ignored.

First, as an initial state, the input signal INS is assumed to be at the L-level (VSS). At this time, the transistors Q2, Q6 are in the off-state. The nodes N2, N3 are charged to the voltage VH-Vthn by the transistors Q3, Q4, respectively, and the transistor Q1 is in the on-state. Therefore, the output node of the inverter made up of the transistors Q1, Q2 (output node of the input stage circuit 100) N1 is at the H-level. Accordingly, the transistor Q5 is in the on-state, and the output terminal OUT (node N6) of the driver circuit is at the H-level.

When the input signal INS shifts from this initial state to the H-level of the voltage VDD at time t0, the transistor Q2 is turned on, and the voltage level of the node N1 falls. Although the transistors Q4, Q1 are both in the on-state at this time, the on-resistance of the transistor Q4 is set sufficiently lower than that of the transistor Q1, and the voltage level of the node N3 are kept at almost VH-Vthn.

Further, when the voltage level of the node N1 falls, the voltage level of the node N2 also intends to fall due to the coupling through the capacitive element C1, but with the transistor Q3 in the on-state, the voltage level of the node N2 is held at VH-Vthn. Hence, the transistor Q1 is held in the on-state.

The voltage level of the node N1 is a value determined by the ratio of the on-resistances (ratio of current driving forces) of the transistors Q1, Q2. The on-resistance of the transistor Q2 is set sufficiently lower than that of the transistor Q1, and the node N1 is almost at L-level of the voltage VSS. Namely, an offset voltage at the output node N1 of the input stage circuit 100 can be made almost zero by setting the on-resistance of the transistor Q2 extremely smaller than the on-resistance of the transistor Q1.

On the other hand, in the output stage circuit 110, the transistor Q6 is turned on when the input signal INS shifts to the H-level at the time t0, and the voltage level of the output terminal OUT (node N6) falls. Further, since the output node N1 of the input stage circuit 100 shifts to the L-level (≈VSS) as described above, a voltage between the gate (node N1) and the source (node N6) of the transistor Q5 becomes lower than the threshold voltage, and the transistor Q5 is turned off. As a consequence, the output terminal OUT (output signal/OUTS) shifts to the L-level of the voltage VSS.

As thus described, when the voltage level of the output terminal OUT falls, the voltage level of the node N3 also intends to fall due to the coupling through the capacitive element C2. However, with the transistor Q4 in the on-state, the voltage level of the node N3 is held at VH-Vthn. As a consequence, the capacitive element C2 is charged to the voltage VH-Vthn since the output terminal OUT is the voltage VSS.

Then, when the input signal INS shifts from the H-level (VDD) to the L-level (VSS) at time t1, the transistor Q2 is turned off in the input stage circuit 100, and an electric charge charged by the capacitive element C2 due to the current flowing through the transistor Q4 flows into the node N1 through the transistor Q1, and the level of the node N1 rises. Accordingly, the transistor Q5 is turned on, and the voltage level of the output terminal OUT rises.

When the voltage level of the output terminal OUT rises, the level of the node N3 rises due to the coupling through the capacitive element C2. Since being diode-connected, the transistor Q4 is turned off when the voltage of the node N3 rises from VH-Vthn. Further, with the transistor Q1 in the on-state and the transistor Q2 in the off-state, the level of the node N1 further rises with the rise of voltage level of the node N3.

As thus described, the rise of the voltage level of the output terminal OUT caused by turning-on of the transistor Q5 is fed back to the gate (node N1) of the transistor Q5. With this positive feedback operation performed, the node N1 reaches such a voltage level as to make the transistor Q5 perform a non-saturated operation, and the output terminal OUT shifts to the H-level of the voltage VH. Namely, the H-level of the output signal/OUTS does not involve a loss corresponding to the threshold voltage of the transistor Q5.

It should be noted that, when the voltage level of the node N1 rises, the voltage level of the gate (node N2) of the transistor Q1 also rises due to the coupling through the capacitive element C1. Since being diode-connected, the transistor Q3 is turned off when the voltage of the node N2 rises from VH-Vthn, and hence the voltage level of the node N2 further rises.

As thus described, the rise of the voltage level of the node N1 caused by the transistor Q1 charging the node N1 is fed back to the gate of the transistor Q1. Namely, the input stage circuit 100 operates as the bootstrap circuit. Therefore, the transistor Q1 is held in the on-state in the non-saturated region even when the voltage level of the node N1 rises, and the positive feedback operation according to the gate voltage of the transistor Q5 is smoothly performed.

As described above, the positive feedback loop according to the gate voltage of the transistor Q5 in the driver circuit is a loop of: (rise of voltage level of the node N1)→(increase in current flowing through the transistor Q5)→(rise of voltage level of the output terminal OUT)→(rise of voltage level of the node N3)→(increase in current flowing through the transistor Q1)→(rise of level of the node N1)→ and so on.

The positive feedback operation is described in more detail. First, immediately before the time t1 of FIG. 2, the voltage levels of the gate (node N2) of the transistor Q1 and the node N3 are both VH−Vthn, the node N1 is almost at the L-level of the voltage VSS, and the output terminal OUT is at the L-level of the voltage VSS.

When the transistors Q2, Q6 are turned off at the time t1, the level of the node N1 rises. This voltage change of the node N1 is coupled to the node N2 through the capacitive element C1, and the level of the node N2 rises from VH−Vthn. The rise of the level of the node N2 leads the transistor Q1 to operate in the non-saturated region, and its drive current to further increase. On the other hand, the rise of the voltage level of the node N1 turns on the transistor Q5, and the level of the output terminal OUT rises due to the current flowing through the transistor Q5.

This change in voltage level of the output terminal OUT is coupled to the node N3 through the capacitive element C2, and the level of the node N3 rises from the VH−Vthn. With the rise of the voltage of the node N3, namely a drain of the transistor Q1, the current flowing through the transistor Q1 operating in the non-saturated region increases, and the voltage level of the node N1 further rises. This rise of the level of the node N1 further raises the gate voltage of the transistor Q5, and the current flowing through the transistor Q5 further increases, leading to further rise of the level of the output terminal OUT.

With repetition of this positive feedback operation, the voltage level of the gate (node N1) of the transistor Q5 sufficiently rises, and the transistor Q5 starts operating in the non-saturated region. Thereby, the ultimate value of the H-level voltage of the output signal/OUTS becomes the voltage VH without involving a loss corresponding to the threshold voltage of the transistor Q5.

Namely, when the output terminal OUT shifts from the L-level (VSS=GND) to the H-level (VH) at the time $t_1$, an amount $\Delta V2$ corresponding to the voltage change is VH. This amount corresponding to the voltage change of the output terminal OUT is coupled to the node N3 having been at the voltage level of VH–Vthn through the capacitive element C2. Assuming that the parasitic capacities of the nodes N3, N1 are sufficiently small with respect to a capacitance value of the capacitive element C2, the level VN3 of the node N3 after the time $t_1$ is expressed by the following formula (1):

$$VN3 = VH - Vthn + \Delta V2 = 2 \cdot VH - Vthn \quad (1)$$

Further, at the time $t_1$, the voltage level of the gate (node N2) of the transistor Q1 becomes sufficiently high in accordance with the rise of the voltage level of the node N1 due to a bootstrap action by the capacitive element C1. As a result, the transistor Q1 operates in the non-saturated region and thereby, the voltage level of the node N3 is transmitted to the node N1 without involving a loss corresponding to the threshold voltage of the transistor Q1. Therefore, the voltage level VN1 of the node N1 after the time $t_1$ is the same as the voltage level VN3 of the node N3.

$$VN1 = VN3 = 2 \cdot VH - Vthn \quad (2)$$

The gate voltage of the transistor Q5 after the time $t_1$ is VN1 in formula (2). Since the drain voltage of the transistor Q5 is VH, setting the value of VH sufficiently larger than the value of Vthn so as to make VN1 sufficiently larger than VH can make the transistor Q5 operate in the non-saturated region.

The amount $\Delta V1$ (=2·VH–Vthn) corresponding to the voltage change at the time t1 raises the voltage level of the node N2 due to the coupling through the capacitive element C1 (bootstrap operation). Therefore, the voltage level VN2 of the node N2 after the time $t_1$ can be expressed by the following formula (3):

$$VN2 = VH - Vthn + \Delta V1 = 3 \cdot VH - 2 \cdot Vthn \quad (3)$$

The gate voltage of the transistor Q1 after the time $t_1$ is VN2 in the formula (3). Since the drain voltage of the transistor Q1 is VN3 in the formula (1), setting the value of VH sufficiently larger than the value of Vthn so as to make VN2 sufficiently larger than VN3 can make the transistor Q1 operate in the non-saturated region.

As thus described, according to the driver circuit of the present embodiment, in the output stage circuit 110, the transistor Q5 is turned on in accordance with the rise of the voltage level of the node N1 in the input stage circuit 100, to raise the voltage level of the output terminal OUT. The transistor Q5 positively feeds back an amount corresponding to the voltage rise of the output terminal OUT to its own gate voltage, thereby to operate in the non-saturated region. Therefore, when the output terminal OUT (output signal/OUTS) is shifted to the H-level, it is possible to raise the output terminal OUT to the voltage VH without involving a loss corresponding to the threshold voltage of the transistor Q5, and its rising speed is high.

Further, at that time, when raising the voltage level of the node N1, the transistor Q1 of the input stage circuit 100 also positively feeds back an amount corresponding to the voltage rise to its own gate, thereby to operate in the non-saturated region (bootstrap action). Therefore, the voltage level of the node N1 does not involve a loss corresponding to the threshold voltage of the transistor Q1, and its rising speed is high. Namely, the input stage circuit 100 raises the gate voltage of the transistor Q5 at high speed, thereby to contribute to an increase in rising speed of the output signal/OUTS.

FIRST MODIFIED EXAMPLE

FIG. 3 is a diagram showing a configuration of a driver circuit as a first modified example of Embodiment 1. In the circuit of FIG. 1, in charging of the output terminal OUT by the transistor Q5, the voltage change of the output terminal OUT was positively fed back to the gate voltage of the transistor Q5. As opposed to this, the driver circuit of FIG. 3 is configured such that a push-pull circuit (hereinafter referred to as "feedback push-pull circuit") is provided separately from a push-pull circuit for driving the output terminal OUT (hereinafter referred to as "driving push-pull circuit"), to feed back a voltage change of an output node of the feedback push-pull circuit to the gate voltage of the transistor Q5.

With reference to FIG. 3, the feedback push-pull circuit is made up of n-type transistors Q7, Q8 serial-connected between the high-side power line 102 and the low-side power line 104. On purpose that this feedback push-pull circuit and the driving push-pull circuit made up of the transistors Q5, Q6 operate in a similar manner, both push-pull circuits are mutually parallel-connected.

Namely, when a connection node between the transistors Q7, Q8 is defined as a node N4, the transistor Q7 is connected between the high-side power line 102 and the node N4, and its gate is connected to the node N1 along with the gate of the transistor Q5. The transistor Q8 is connected between the node N4 and the low-side power line 104, and its gate is connected to the input terminal IN along with the gate of the transistor Q6. The output node of the feedback push-pull circuit is the node N4. In the present modified example, the capacitive element C2 is connected between this node N4 and the node N3, and is not connected to the output terminal OUT.

Since the feedback push-pull circuit operates in the manner similar to the driving push-pull circuit, the voltage level of the node N4 in principle changes in a manner similar to the voltage level of the output terminal OUT (node N6). Therefore, between the circuit of FIG. 3 and the circuit of FIG. 1, the respective capacitive element C2 are connected to different designations, but the operations thereof are almost the same. However, in the circuit of FIG. 3, roles are divided such that the feedback push-pull circuit exclusively performs a positive feedback operation by the use of the capacitive element C2, and the driving push-pull circuit exclusively drives a load capacitance connected to the output terminal OUT.

In this modified example, a route of the positive feedback loop according to the gate voltage of the transistor Q5 is different from that of FIG. 1. Namely, the positive feedback operation is performed not based upon the output terminal OUT, but based upon a signal of the node N4 separate therefrom.

Since the output terminal OUT is connected with the load capacitance, it is considered that the rising speed of the output signal/OUTS decreases due to the influence of its capacitance value. In the circuit of FIG. 1, since the voltage change of the output terminal OUT is positively fed back to the gate voltage of the transistor Q5, when the rising speed of the output signal/OUTS decreases, the rising speed of the gate voltage of the transistor Q5 is influenced, causing a further decrease in rising speed of the output signal/OUTS.

As opposed to this, in the circuit of FIG. 3, since the voltage change of the node N4 separate from the output terminal OUT is positively fed back to the gate voltage of the transistor Q5, the positive feedback operation is not influenced by the rising speed of the output signal/OUTS. Namely, it is not influenced by the load capacitance connected to the output terminal OUT.

Further, since the load capacitance is not connected to the node N4, the rising speed of the voltage level is normally higher than that of the output terminal OUT. Therefore, the rising speeds of the voltage levels of the nodes N3 and N1 (gate of the transistor Q5) in the positive feedback operation are increased more than in the circuit of FIG. 1, whereby it is possible to increase the rising speed of the output signal/OUTS more than in the circuit of FIG. 1.

SECOND MODIFIED EXAMPLE

FIG. 4 is a diagram showing a configuration of a driver circuit as a second modified example of Embodiment 1. The driver circuit is formed by interposing an n-type transistor Q9 with its gate connected to the high-side power line 102 between the transistor Q1 and the transistor Q2 of the input stage circuit 100 in the circuit of FIG. 1.

The gate of the transistor Q5 and the capacitive element C2 are connected to a drain side (node N1) of the transistor Q9, and the node N1 becomes the output node of the input stage circuit 100. Further, here, the connection node between the transistors Q9, Q2 is defined as a node N5. Since the gate of the transistor Q9 is fixed at the H-level (VH), the transistor Q9 is constantly in the on-state.

In the circuit of FIG. 1, when the input signal INS is at the L-level (VSS), the voltage level VN1 of the node N1 becomes a high voltage of 2·VH−Vthn, as shown in the above formula (2). At this time, that high voltage is applied between the drain and the gate of the transistor Q2 since the level of the input terminal IN is VSS.

It is known that in a thin film transistor formed by a low-temperature polysilicon process, when a high voltage is applied between the drain and the gate for a long period of time, the on-resistance becomes high. Therefore, when such a transistor is used in the driver circuit of FIG. 1, it is feared that the on-resistance of the transistor Q2 may increase. Since the transistors Q1, Q2 constitute the ratio-type inverter, the increase of the on-resistance of the transistor Q2 causes an output offset voltage at the output node N1 of the input stage circuit 100 to increase, and the operating margin of the driver circuit to fall, which is problematic.

In the circuit of FIG. 4, when the node N1 is at the high voltage level of 2·VH−Vthn, a voltage between the drain (node N1) and the gate (high-side power line 102) of the transistor Q9 is VH−Vthn. Further, since the level of the node N5 is VH−Vthn at this time, a voltage between the drain (node N5) and the gate (input terminal IN) of the transistor Q2 also becomes VH−Vthn.

As thus described, when the input signal INS is at the L-level, the high voltage VN1 (=2·VH−Vthn) of the node N1 is divided by the transistors Q9, Q2, and held. Hence, the respective drain-gate voltages of the transistors Q9, Q2 are held relatively low, to prevent the on-resistances thereof from rising.

On the other hand, when the input signal INS is at the L-level, the node N2 also becomes the high voltage VN2 (=3·VH−2·Vthn) shown in the formula (3), and thereby, a voltage between the drain (node N2) and the gate (high-side power line 102) of the transistor Q3 becomes a high voltage of 2·VH−2·Vthn. However, in the transistor Q3, a current to such a degree as to compensate a leak current at the node N2 is an adequate supply, and a high current driving force is not required. Therefore, in the transistor Q3, the rise of the on-resistance is not so problematic.

It is to be noted that in the circuit of FIG. 4, the gate of the transistor Q9 is connected to the high-side power line 102, and its voltage is set to VH. However, a voltage different from the voltage VH may be supplied to the gate of the transistor Q9 so long as being a voltage capable of suppressing the respective drain-gate voltages of the transistors Q9, Q2. Further, although the configuration formed by providing the transistor Q9 in the circuit of FIG. 1 was shown in FIG. 4, it may be provided between the transistors Q1, Q2 in the circuit of FIG. 3, from which a similar effect can be obtained.

THIRD MODIFIED EXAMPLE

As thus described, in the transistor Q3 in the circuit of FIG. 1, since a current to such a degree as to compensate a leak current at the node N2 is an adequate supply, a high current driving force is not required. Therefore, the rise of the on-resistance of the transistor Q3 is not so problematic.

However, when the rise of the on-resistance in the transistor Q3 is wished to be suppressed, a driver circuit of FIG. 5 may be used. The driver circuit is formed by interposing a transistor Q10 with its gate connected to the node N3 between the gate (node N2) of the transistor Q1 and the transistor Q3 in the circuit of FIG. 1. Here, the connection node between the transistors Q3, Q10 is defined as a node N5a.

In the circuit of FIG. 5, when the input signal INS is at the L-level, a voltage between the gate (high-side power line 102) and the source (node N5a) of the transistor Q3 is substantially [VH−(2·VH−2−Vthn)]=−(VH−2·Vthn). Further, at this time, a voltage between the gate (node N3) and the source (node N2) of the transistor Q10 is substantially [(2·VH−Vthn)−(3·VH−2·Vthn)]=(VH−Vthn).

As thus described, when the input signal INS is at the L-level, the high voltage (2·VH−2·Vthn) between the node N2 and the high-side power line 102 is divided by the transistors Q3, Q10, and held. Hence, the respective drain-gate voltages of the transistors Q3, Q10 are held relatively low, to prevent the on-resistances thereof from rising.

It is to be noted that, although the configuration formed by providing the transistor Q10 in the circuit of FIG. 1 is shown in FIG. 5, it may be provided between the gate (node N2) of the transistor Q1 and the transistor Q3, from which a similar effect can be obtained.

FOURTH MODIFIED EXAMPLE

Figure 6:
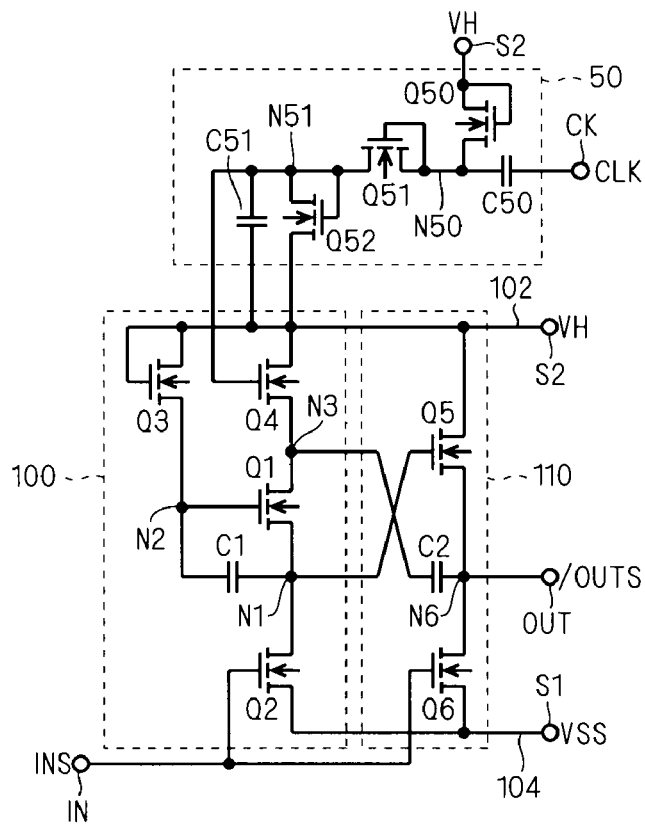
FIG. 6 is a circuit diagram showing a fourth modified example of the driver circuit according to Embodiment 1.

FIG. 6 is a driver circuit as a fourth modified example of Embodiment 1, which is a circuit where the rising speed of the output signal/OUTS is further increased. The driver circuit is formed by providing a voltage generating circuit 50 in the circuit of FIG. 1. This voltage generating circuit 50 serves to supply a voltage of VH+Vthn to the gate of the transistor Q4, and is made up of n-type transistors Q50 to Q52 and capacitive elements C50, C51, as in FIG. 6.

The transistors Q50, Q51 are both diode-connected, and are serial-connected between the high-side power node S2, supplied with the voltage VH, and the gate (node N51) of the transistor Q4. When a connection node between the transistors Q50, Q51 is defined as a node N50, the transistor Q50 functions as a diode taking the direction from the high-side power node S2 to the node N50 as a forward direction, and the transistor Q51 functions as a diode taking the direction from the node N50 to the node N51 as a forward direction.

The capacitive element C50 is connected between a terminal CK (repeat signal input terminal), into which a predetermined repeat signal CLK is inputted, and the node N50. Here, an amplitude of the repeat signal CLK is assumed to be VH.

These transistors Q50, Q51 and the capacitive element C50 constitute a charge pump circuit. Namely, the transistor Q50 supplies the voltage of VH−Vthn to the node N50, and the capacitive element C50 raises the voltage to 2·VH−Vthn in accordance with the rising of the repeat signal CLK. Therefore, the transistor Q51 is capable of supplying a voltage of substantially 2·VH−2·Vthn to the output node N51 of the charge pump circuit.

However, a transistor Q52, diode-connected such that a direction from the node N51 to the high-side power line 102 is a forward direction, is connected between the node N51 and the high-side power line 102, and this clamps the voltage of the node N51 to VH+Vthn. Further, the capacitive element C51 connected between the node N51 and the high-side power line 102 is provided for stabilizing a voltage level of the node N51.

In the circuit of FIG. 6, since the gate voltage of the transistor Q4 is fixed to VH+Vthn, the transistor Q4 can charge the node N3 to the voltage of VH. Namely, since the voltages of the nodes N3, N1 can be made higher by Vthn, an on-resistance of the transistor Q5 becomes smaller, thereby to increase the rising speed of the output signal/OUTS.

Further, when the voltage of the node N3 is raised in accordance with the rising of the output signal/OUTS (at this time, the high-side power line 102 side becomes a source since a potential of the node N3 is higher than that of the high-side power line 102), a gate-source voltage of the transistor Q4 becomes Vthn, and only a sub-threshold current flows through the transistor Q4, thereby bringing the transistor Q4 practically into the off-state. Therefore, a current does not flow from the node N3 to the high-side power line 102.

Supposing that the gate voltage of the transistor Q4 is set higher than VH+Vthn, the gate-source voltage of the node N3 exceeds the threshold voltage Vthn in raising of the voltage of the node N3, and hence the current flows from the node N3 to the high-side power line 102 (the transistor Q4 stops functioning as the unilateral current driving element). This causes the node N3 to be insufficiently raised, resulting in failure to normally operate the positive feedback operation according to the gate voltage of the transistor Q5. It is for the sake of avoiding such a defect that the transistor Q52 clamps the gate voltage of the transistor Q4 to VH+Vthn in the voltage generating circuit 50.

It should be noted that the voltage to be supplied to the drain and the gate of the transistor Q50 of the voltage generating circuit 50 is not restricted to VH, neither is the voltage corresponding to the amplitude of the repeat signal CLK. Those values may be arbitrary values so long as being in such a range that the voltage generating circuit 50 can supply the node N51 with the voltage VH+Vthn.

Further, from the view point of simplifying the manufacturing process, the transistors Q50 to Q52 and the capacitive elements C50, C51 included in the voltage generating circuit 50 are preferably formed on the same substrate as are the input stage circuit 100 and the output stage circuit 110. However, discrete diode elements may be used in place of the diode-connected transistors Q50 to Q52, and discrete elements may also be used for the capacitive elements C50, C51.

Further, the above-mentioned first to third modified examples may also be applied to the input stage circuit 100 and the output stage circuit 110 in the driver circuit of the present modified example. This also applies to the following modified examples.

FIFTH MODIFIED EXAMPLE

FIG. 7 is a driver circuit as a fifth modified example of Embodiment 1, which is a circuit formed by supplying the voltage generating circuit 50 with the output signal/OUTS in place of the repeat signal CLK in the circuit of FIG. 6 (fourth modified example). Namely, the charge pump circuit constituting the transistor Q5 is driven by the output signal/OUTS. Except for this, the driver circuit has a similar configuration to that of FIG. 6.

According to the present modified example, the need for supplying the particular repeat signal CLK for making the voltage generating circuit 50 operate is eliminated. Namely, since the number of control signals required for the operation of the driver circuit is small as compared with the circuit of FIG. 6, the repeat signal input terminal CK, wiring accompanied thereto, and the like can be omitted, so as to contribute reduction in footprint of the circuit.

It is to be noted that, since the signal that drives the voltage generating circuit 50 (charge pump circuit) may be any signal so long as its voltage level repeatedly changes, it can also be driven, for example, by the input signal INS other than the output signal/OUTS (this case is not shown). Since it is not necessary also in this case to supply the particular repeat signal CLK, a similar effect to the above can be obtained.

SIXTH MODIFIED EXAMPLE

FIG. 8 is a driver circuit as a sixth modified example of Embodiment 1, which is a circuit formed by also supplying the gate of the transistor Q3 with the voltage VH+Vthn generated by the voltage generating circuit 50 in the circuit of FIG. 6 (fourth modified example). The driver circuit has a similar configuration to that of FIG. 6 except for connection of the gate of the transistor Q3 to the node N51.

According to the present modified example, since the transistor Q3 becomes capable of charging the node N2 to the level of the voltage VH, the voltage of the node N2 becomes higher by an amount of Vthn than in the circuit of FIG. 1. Therefore, the on-resistance of the transistor Q1 decreases, to increase the rising speed of the signal of the node N1 (output signal of the input stage circuit 100), resulting in further improvement in rising speed of the output signal/OUTS. The present modified example is also applicable to another modified example using the voltage generating circuit 50 (e.g. circuit of FIG. 7).

Here, the transistors Q1, Q2 constitute the ratio-type inverter, and its L-level voltage is determined based upon a ratio of on-resistances of the transistors Q1, Q2. It is therefore necessary to note that in the case of lowering the on-resistance value of the transistor Q1 by means of the present modified example, unless the on-resistance value of the transistor Q2 is also lowered accordingly, the output offset voltage of the inverter increases. For lowering the on-resistance value of the transistor Q2, its gate width may be increased.

SEVENTH MODIFIED EXAMPLE

FIG. 9 is a driver circuit as a seventh modified example of Embodiment 1, which is a circuit with the amplitude of the output signal/OUTS increased. The driver circuit is formed by providing a voltage generating circuit 60 in the circuit of FIG. 1. This voltage generating circuit 60 serves to supply a voltage of 2·VH−2·Vthn to the drain of the transistor Q5, and is made up of n-type transistors Q60, Q61 and capacitive elements C60, C61 as in FIG. 6.

The transistors Q60, Q61 are both diode-connected, and those are serial-connected between the high-side power node S2, supplied with the voltage VH, and the drain (node N61) of the transistor Q5. When a connection node between the transistors Q60, Q61 is defined as a node N60, the transistor Q60 functions as a diode taking the direction from the high-side power node S2 to the node N60 as a forward direction, and the transistor Q61 functions as a diode taking the direction from the node N60 to the node N61 as a forward direction. The capacitive element C60 is connected between the terminal CK (repeat signal input terminal), into which the predetermined repeat signal CLK is inputted, and the node N60. Here, the amplitude of the repeat signal CLK is assumed to be VH.

These transistors Q60, Q61 and the capacitive element C60 constitute a charge pump circuit. Namely, the transistor Q60 supplies the voltage of VH−Vthn to the node N60, and the capacitive element C60 raises the voltage to 2·VH−Vthn in accordance with the rising of the repeat signal CLK. The transistor Q61 is capable of supplying a voltage of substantially 2·VH−2·Vthn to the output node N61 of the charge pump circuit. The capacitive element C61 connected between the node N61 and the high-side power line 102 is provided for stabilizing a voltage level of the node N61.

Since the transistors Q5, Q6 that constitute the push-pull circuit of the output stage circuit 110 are complementarily (alternately) turned on, a direct current does not flow between the drain (node N61) of the transistor Q5 and the low-side power line 104. Therefore, the output stage circuit 110 can normally operate even with the use of the voltage generating circuit 60, which is a charge pump circuit with a relatively high output impedance, as the high-side power source.

In the present modified example, since the high-side power voltage that is supplied to the output stage circuit 110 increases, the amplitude of the output signal/OUTS increases. Also in this case, the voltages of the nodes N3, N1 are raised in rising of the output signal/OUTS, and the transistor Q5 operates in the non-saturated region, whereby the H-level voltage of the output signal/OUTS becomes substantially 2·VH−2·Vthn, as is the voltage of the node N61.

Further, although not shown, the output signal/OUTS or the input signal INS may be supplied to the voltage generating circuit 60 in place of the repeat signal CLK, as was done to the voltage generating circuit 50 in the above-mentioned fifth modified example. Since this eliminates the need for supplying the particular repeat signal CLK, the repeat signal input terminal CK and wiring accompanied thereby and the like can be omitted, so as to contribute reduction in footprint of the circuit.

EIGHTH MODIFIED EXAMPLE

FIG. 10 is a driver circuit as an eighth modified example of Embodiment 1, and is an example where the voltage generating circuit 60 shown in the seventh modified example (FIG. 9) is applied to the driver circuit of the first modified example (FIG. 3). As shown in FIG. 10, in the driver circuit, both a drain of the transistor Q5 of the driving push-pull circuit and a drain of the transistor Q7 of the feedback push-pull circuit are connected to the node N61 of the voltage generating circuit 60. Namely, substantially 2·VH−2·Vthn are supplied from the voltage generating circuit 60 to both drains of the transistors Q5, Q7.

The transistors Q5, Q6 of the driving push-pull circuit are complementarily (alternately) turned on, and similarly, the transistors Q7, Q8 of the feedback push-pull circuit are also complementarily (alternately) turned on, whereby direct currents do not flow between the drains (node N61) of the transistors Q5, Q7 and the low-side power line 104. Therefore, the output stage circuit 110 can normally operate even with the use of the voltage generating circuit 60, which is a charge pump circuit with a relatively high output impedance, as the high-side power source.

In the present modified example, since the high-side power voltage that is supplied to the output stage circuit 110 increases, the amplitudes of the output signal/OUTS and the signal of the node N4 increase. Also in this case, the voltages of the nodes N3, N1 are raised in rising of the signal of the node N4, and the transistor Q5 operates in the non-saturated region, whereby the H-level voltage of the output signal/OUTS becomes substantially 2·VH−2·Vthn, as is the voltage of the node N61.

Although the voltage generated by the voltage generating circuit 60 is supplied to both the drains of the transistors Q5, Q7 in the present modified example, the voltage may be supplied only to the drain of the transistor Q7, and the drain of the transistor Q5 may be kept connected to the high-side power line 102 as in FIG. 3. In such a case, although the H-level voltage of the output signal/OUTS becomes the same VH as in the case of FIG. 3, since the gate voltage of the transistor Q5 increases, the rising speed of the output signal/OUTS is improved more than in the case of FIG. 3.

Further, also in the present modified example, the output signal/OUTS or the input signal INS may be supplied to the voltage generating circuit 60 in place of the repeat signal CLK. Since this eliminates the need for supplying the particular repeat signal CLK, the repeat signal input terminal CK and wiring accompanied thereby and the like can be omitted, so as to contribute reduction in footprint of the circuit.

NINTH MODIFIED EXAMPLE

As one technique for increasing the rising speed of the output signal/OUTS in the circuit of FIG. 1, it is considered that the driving ability of the input stage circuit 100 is enhanced, to increase the rising speed (charging speed) of the gate voltage of the transistor Q5. However, since the transistors Q1, Q2 of the input stage circuit 100 are the ratio-type circuit, there is a limit in increasing the driving ability of the transistor Q1 from the view point of reduction in power consumption.

FIG. 11 is a driver circuit as a ninth modified example of Embodiment 1, which is a circuit formed by increasing the rising speed of the output signal/OUTS while suppressing an increase in current consumption. In the circuit of FIG. 1, the signal of the output node N1 of the input stage circuit 100 was directly supplied to the gate of the transistor Q5 of the output stage circuit 110. However, in the present modified example, a push-pull circuit 120 is interposed between the input stage circuit 100 and the output stage circuit 110. This push-pull circuit 120 serves to charge the gate of the transistor Q5 of the output stage circuit 110 at high speed.

Although an operation of the push-pull circuit 120 is described later, since an output-level voltage of the push-pull circuit 120 is raised in accordance with the rising of the output signal/OUTS, the circuit is referred to as a "step-up push-pull circuit" in the following description.

The step-up push-pull circuit 120 is made up of the n-type transistors Q1a, Q2a, Q4a, and the capacitive element C1a. In the step-up push-pull circuit 120, the transistors Q4a, Q1a, Q2a are serial-connected in this order between the high-side power line 102 and the low-side power line 104.

When a connection node between the transistors Q4a, Q1a is defined as a node N3a, and a connection node between the transistors Q1a, Q2a as a node N1a, a gate of the transistor Q4a, connected between the high-side power line 102 and the node N3a, is connected to the high-side power line 102 (the transistor Q4a is diode-connected), and functions as a unilateral current drive element taking the direction from the high-side power line 102 to the node N3a as a forward direction. A gate of the transistor Q1a connected between the node N3a and the node N1a is connected to the output node N1 of the input stage circuit 100. A gate of the transistor Q2a, connected between the node N1a and the low-side power line 104, is connected to the input terminal IN. Further, the capacitive element C1a is connected between the node N1a and the node N3 of the input stage circuit 100.

The above-mentioned N1a is an output node of the step-up push-pull circuit 120. The transistor Q1a is a pull-up transistor that charges it to the H-level, and the transistor Q2a is a pull-down transistor that discharges it to the L-level.

The gate of the transistor Q5 of the output stage circuit 110 is connected to the node N1a of the step-up push-pull circuit 120. Further, the capacitive element C2 is connected between the node N6 (output terminal OUT) of the output stage circuit 110 and the node N3a of the step-up push-pull circuit 120.

In the driver circuit of FIG. 11, the output stage circuit 110 is driven by the step-up push-pull circuit 120, and the step-up push-pull circuit 120 is driven by the input stage circuit 100. The driving ability of the step-up push-pull circuit 120 is set larger than that of the input stage circuit 100. Namely, the driving ability of the transistor Q1a is set larger than the driving ability of the transistor Q1.

That is, the transistors Q1a, Q2a function as a buffer circuit for enhancing the driving ability of the signal of the node N1, and the diode-connected transistor Q4a supplies the high-side power voltage to this buffer circuit. Since the transistors Q1a, Q2a constitute a ratioless circuit where the transistors are complementarily (alternately) turned on, a direct current does not flow through the transistors Q1a, Q2a. Therefore, even when the driving ability of the transistor Q1a is set large, the current consumption hardly increases.

It is to be noted that, since the push-pull circuit that drives the output terminal OUT in the output stage circuit 110 drives a load capacitance connected to the output terminal OUT, its driving ability is set larger than that of the step-up push-pull circuit 120. Namely, the driving ability of the transistor Q5 is set larger than the driving ability of the transistor Q1a.

As thus described, an electric amplification degree of the transistor increases from the node N1 toward the output terminal OUT (in the order of the transistor Q1 that charges the node N1, the transistor Q1a that charges the node N1a, the transistor Q5 that charges the output terminal OUT). Therefore, even when the current flowing through the transistor Q1 of the input stage circuit 100 is small, it is possible to raise the gate voltage of the transistor Q5 of the output stage circuit 110 at high speed. Namely, it is possible to seek an increase in the rising speed of the output signal/OUTS, while holding the direct current in the input stage circuit 100 small to suppress power consumption.

In the following, an operation of the driver circuit is described. When the input signal INS is at the H-level, the node N1 of the input stage circuit 100 is at the L-level, and hence in the step-up push-pull circuit 120, the transistor Q2a is in the on-state, and the transistor Q1a is in the off-state. The node N1a is thus at the L-level of the voltage VSS. Therefore, in the output stage circuit 110, the transistor Q5 is in the off-state, the transistor Q6 is in the on-state, and the output terminal OUT (output signal/OUTS) is at the L-level of the voltage VSS.

Then, the node N1 of the input stage circuit 100 shifts to the H-level when the input signal INS shifts to the L-level, and thereby in the step-up push-pull circuit 120, the transistor Q1a comes into the on-state and the transistor Q2a comes into the off-state. At this time, since the voltage of the node N3a is VH−Vthn, the node N1a shifts to the H-level. Accordingly, in the output stage circuit 110, the transistor Q5 comes into the on-state, the transistor Q6 comes into the off-state, and the output terminal OUT (output signal/OUTS) shifts to the H-level of the voltage VH.

When the output terminal OUT shifts from the L-level (VSS) to the H-level (VH), the voltage of the node N3a is raised to substantially 2·VH−Vthn due to the coupling through the capacitive element C2. Accordingly, a voltage of the node N1a also rises, and this rise of the voltage of the node N1a raises the voltages of the nodes N3, N1 of the input stage circuit 100 through the capacitive element C1a, and is positively fed back to a gate voltage of the transistor Q1a. Therefore, the transistor Q1a performs the non-saturated operation, and the voltage of the node N1a rises to substantially 2·VH−Vthn. The transistor Q5 thus operates in the non-saturated region, thereby increasing the rising speed of the output signal/OUTS.

It should be noted that, when the voltage of the node N1a rises to substantially 2·VH−Vthn, the node N3 rises to substantially 3·VH−2·Vthn due to the coupling through the capacitive element C1a. Accordingly, a voltage level of the node N1 also rises, but since the transistor Q1 performs the non-saturated operation due to the bootstrap action by the capacitive element C1, the level of the node N1 rises to substantially 3·VH−2·Vthn.

According to the present modified example, the gate of the transistor Q5 is charged to substantially 2·VH−Vthn at high speed by the transistor Q1a having higher driving ability than the transistor Q1. Namely, since the rising speed of the gate voltage of the transistor Q5 becomes higher than in the circuit of FIG. 1, the rising speed of the output signal/OUTS increases.

However, in the present modified example, differently from the circuit of FIG. 1, the gate of the transistor Q5 of the output stage circuit 110 is not directly connected to the node N1 of the input stage circuit 100, and the step-up push-pull circuit 120 is interposed therebetween. Therefore, the charging operation of the node N1a by the transistor Q1a is interposed between the rise of the voltage of the node N1 and the rise of the gate voltage of the transistor Q5, and hence it is necessary to note that delay time between the falling timing of the input signal INS and the rising timing of the output signal/OUTS becomes long.

TENTH MODIFIED EXAMPLE

FIG. 12 is a diagram showing a driver circuit according to a tenth modified example of Embodiment 1. The present modified example is an example further modified from the circuit of FIG. 11. In this example, a multistage step-up push-pull circuit 120a made up of a plurality of stages (n stages) of unit circuits each made up of the transistors Q1a, Q2a, Q4a and the capacitive element C1a is provided in place of the step-up push-pull circuit 120 of FIG. 11, including only one stage of the unit circuit.

In the multistage step-up push-pull circuit 120a, a front-stage unit circuit made up of transistors Q1a1, Q2a1, Q4a1 and a capacitive element C1a1 is driven by the input stage circuit 100 as in a manner similar to the step-up push-pull circuit 120 of FIG. 11. Each of unit circuits of a second stage and following stages is driven by a unit circuit one step forward. The output stage circuit 110 as the output stage is driven by a last-stage unit circuit. Under the multistage step-up push-pull circuit 120a, in the plurality of unit circuits constituting this circuit, the driving ability of the transistor Q1a (Q1a1 to Q1an) in the unit circuit of a more subsequent stage is set larger.

According to the present modified example, it is possible to set the driving ability of the last-stage transistor Q1*an* that charges the gate of the transistor Q5 extremely large. Therefore, even when the driving ability (gate width) of the transistor Q5 is designed large so as to deal with a case where a load capacitance connected to the output terminal OUT is extremely large, the gate can be charged at high speed, so as to prevent the rising speed of the output signal/OUTS from decreasing.

ELEVENTH MODIFIED EXAMPLE

FIG. 13 is a diagram showing a driver circuit according to an eleventh modified example of Embodiment 1. The present modified example is an example further modified from the circuit of FIG. 12, to which the output stage circuit 110 shown in FIG. 3 (first modified example) is applied.

Namely, in a similar manner to the first modified example, based upon the output node N4 of the feedback push-pull circuit different from the driving push-pull circuit for driving the output terminal OUT, the positive feedback operation according to the gate voltage of the transistor Q5 is performed. As described in the first modified example, with the use of the output stage circuit 110, its positive feedback operation is performed without being influenced by the rising speed of the output signal/OUTS. Therefore, with the operation of the driver circuit not influenced by the load capacitance, it is possible to stably increase the rising speed of the output signal/OUTS more than in the case of FIG. 12.

TWELFTH MODIFIED EXAMPLE

FIG. 14 is a driver circuit according to a twelfth modified example of Embodiment 1, which is an example where the voltage generating circuit 60 shown in the seventh modified example (FIG. 9) is applied to the driver circuit of the ninth modified example (FIG. 11). As shown in FIG. 14, in the driver circuit, the drain of the transistor Q5 of the output stage circuit 110 and a gate and a drain of the transistor Q4*a* of the step-up push-pull circuit 120 are connected to the node N61 of the voltage generating circuit 60. Namely, both the drains of the transistors Q5, Q4*a* are supplied with substantially 2·VH−2·Vthn from the voltage generating circuit 60.

The transistors Q5, Q6 that constitute the push-pull circuit of the output stage circuit 110 are complementarily (alternately) turned on. Similarly, in the step-up push-pull circuit 120, the transistors Q1*a*, Q2*a* which are serial-connected to the transistor Q4*a* are also complementarily (alternately) turned on. Hence a direct current does not flow between the drains (node N61) of the transistors Q5, Q4*a* and the low-side power line 104. Therefore, the output stage circuit 110 and the step-up push-pull circuit 120 can normally operate even with the use of the voltage generating circuit 60, which is a charge pump circuit with a relatively high output impedance, as the high-side power source.

In the present modified example, since the high-side power voltage that is supplied to the output stage circuit 110 and the step-up push-pull circuit 120 increases, the amplitudes of the output signal/OUTS and signals of the nodes N3*a*, N1*a* increase. Also in this case, the voltages of the nodes N3*a*, N1*a* are raised in rising of the output signal/OUTS, and the transistor Q5 operates in the non-saturated region, whereby the H-level voltage of the output signal/OUTS becomes substantially 2·VH−2·Vthn, as is the voltage of the node N61.

Further, although the voltage generated by the voltage generating circuit 60 is supplied to both the drains of the transistors Q4*a*, Q5 in the present embodiment, the voltage may be supplied only to the transistor Q4*a*, and the drain of the transistor Q5 may be kept connected to the high-side power line 102 as in FIG. 11. In such a case, although the H-level voltage of the output signal/OUTS becomes the same VH as in the case of FIG. 11, since the gate voltage of the transistor Q5 becomes higher, the rising speed of the output signal/OUTS is improved more than in the case of FIG. 11.

Also in the present modified example, the output signal/OUTS or the input signal INS may be supplied to the voltage generating circuit 60 in place of the repeat signal CLK. Since this eliminates the need for supplying the particular repeat signal CLK, the repeat signal input terminal CK and wiring accompanied thereby and the like can be omitted, so as to contribute reduction in footprint of the circuit.

Although not shown, the voltage generating circuit 60 is also applicable to the circuits of FIGS. 12, 13 that include the multistage step-up push-pull circuit 120*a* made up of a plurality of unit circuits. Namely, in the multistage step-up push-pull circuit 120*a* of FIGS. 12, 13, respective gates and drains of the transistors Q4*a*1 to Q4*an* may be connected to the node N61 of the voltage generating circuit 60. Naturally, the drain of the transistor Q5 (and the transistor Q7) of the output stage circuit 110 in FIGS. 12, 13 may also be connected to the node N61 of the voltage generating circuit 60.

THIRTEENTH MODIFIED EXAMPLE

FIG. 15 is a driver circuit according to a thirteenth modified example of Embodiment 1, which is formed by increasing the rising speed of the output signal/OUTS. The driver circuit is formed in the circuit of FIG. 3 (first modified example) by interposing a transistor Q11 between the drain of the transistor Q7 and the high-side power line 102, and also connecting a capacitive element C3 between a connection node (node N7) of the transistors Q7, Q11 and the output terminal OUT (node N6). A gate of the transistor Q11 is connected to the high-side power line 102 (transistor Q11 is diode-connected), and functions as a unilateral current drive element taking the direction from the high-side power line 102 to the node N7 as a forward direction.

In the output stage circuit 110, the high-side power node of the push-pull circuit made up of the transistors Q7, Q8 is the node N7, and the voltage VH−Vthn is supplied to the node N7 through the transistor Q11. However, in rising of the output signal/OUTS, a voltage of the node N7 is shift to 2·VH−Vthn due to the coupling through the capacitive element C3. Accordingly, a voltage of the node N4 also becomes substantially 2·VH−Vthn. At this time, the voltages of the node N3 and the node N1 (gate of the transistor Q5) increase to 3·VH−Vthn due to the coupling through the capacitive element C2.

In the present modified example, the gate voltage of the transistor Q5 can be made higher than in the cases of FIGS. 1, 3, etc (substantially 2·VH−Vthn). Thereby, the driving ability of the transistor Q5 improves, and the rising speed of the output signal/OUTS increases.

It is to be noted that, although the configuration of FIG. 15 was described as one modified from the configuration of the output stage circuit 110 in the circuit of FIG. 3 (first modified example), the application of the present modified example is not restricted to that. Namely, the output stage circuit 110 in driver circuits of other embodiments and modified examples may be replaced by the output stage circuit 110 of FIG. 15.

FOURTEENTH MODIFIED EXAMPLE

The output stage circuit 110 shown in the thirteenth modified example (FIG. 15) is structurally similar to the circuit in FIG. 3 (first modified example), but the purpose for providing the push-pull circuit made up of the transistors Q7, Q8 separately from the push-pull circuit made up of the transistors Q5, Q6 which drives the output terminal OUT is different. In the circuit of FIG. 3, the push-pull circuit was provided for the purpose of performing the positive feedback operation according to the gate voltage of the transistor Q5 based upon the node N4 separate from the output terminal OUT. Namely, the circuit serves to suppress a decrease in rising speed of the output signal/OUTS by preventing an influence of the load capacitance connected to the output terminal OUT on the positive feedback operation.

As opposed to this, in the circuit of FIG. 15, the positive feedback operation is performed such that the rise of the voltage of the output terminal OUT raises the voltage of the node N7 through the capacitive element C3, and the rise is transmitted to the gate voltage of the transistor Q5 through the nodes N4, N3, N1. Namely, in the circuit of FIG. 15, the voltage change of the output terminal OUT is involved in the above-mentioned positive feedback operation, and when the load capacitance connected to the output terminal OUT increases, it has an influence on the positive feedback operation.

This being the case, in the present modified example, the technique of the above-mentioned first modified example is applied, so as to prevent the influence of the load capacitance connected to the output terminal OUT on the positive feedback operation.

FIG. 16 is a circuit diagram of the driver circuit according to the present modified example, which is a circuit formed by further providing a feedback push-pull circuit made up of transistors Q7D, Q8D in the circuit of FIG. 15. This feedback push-pull circuit and the driving push-pull circuit made up of the transistors Q5, Q6 are mutually parallel-connected so as to operate in a similar manner Namely, when a connection node between the transistors Q7D, Q8D is defined as a node N4D, the transistor Q7D is connected between the high-side power line 102 and the node N4D, and its gate is connected to the node N1 along with the gate of the transistor Q5. The transistor Q8D is connected between the node N4D and the low-side power line 104, and its gate is connected to the input terminal IN along with the gate of the transistor Q6.

The output node of the feedback push-pull circuit is the node N4D. In the present modified example, the capacitive element C3 is connected between the node N4D and the node N7, and is not connected to the output terminal OUT.

A voltage level of the node N4D changes similarly to the output terminal OUT (node N6). Therefore, between the circuit of FIG. 16 and the circuit of FIG. 15, the respective capacitive element C3 are connected to different designations, but the operations thereof are almost the same. However, in the circuit of FIG. 16, roles are divided such that the feedback push-pull circuit is exclusively performs a positive feedback operation by the use of the capacitive element C3, and the driving push-pull circuit exclusively drives a load capacitance connected to the output terminal OUT.

Namely, the positive feedback operation according to the gate voltage of the transistor Q5 is performed based upon a signal of the output node N4D of the feedback push-pull circuit separate from the output terminal OUT. Therefore, according to the present modified example, due to a combined effect of the thirteenth modified example and the third modified example, it is possible to further increase the rising speed of the output terminal OUT (output signal/OUTS).

It is to be noted that, although the configuration of FIG. 16 was described as one modified from the configuration of the output stage circuit 110 in the circuit of FIG. 15 (thirteen modified example), the application of the present modified example is not restricted to that. Namely, the output stage circuit 110 in driver circuits of other embodiments and modified examples may be replaced by the output stage circuit 110 of FIG. 16.

FIFTEENTH MODIFIED EXAMPLE

Figure 17:
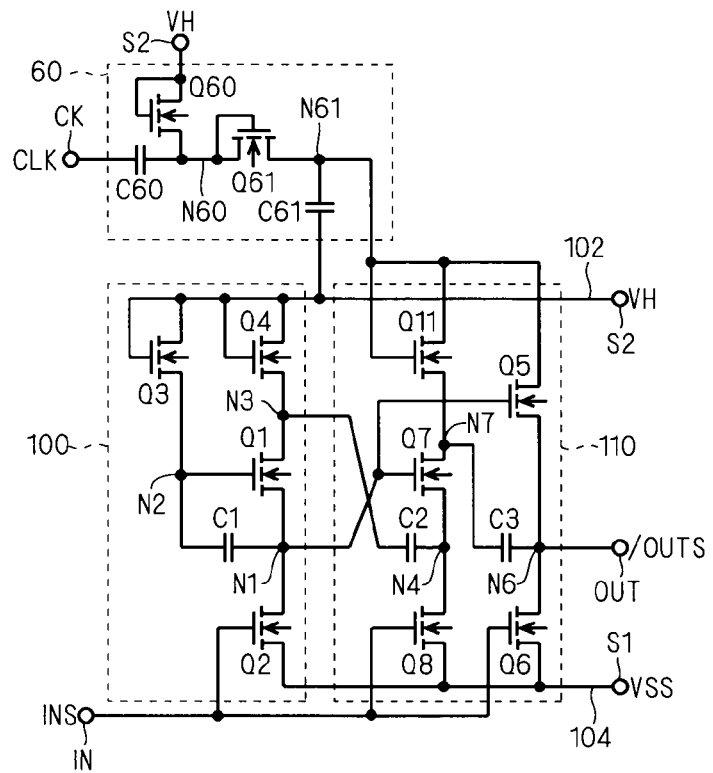
FIG. 17 is a circuit diagram showing a fifteenth modified example of the driver circuit according to Embodiment 1.

FIG. 17 is a driver circuit according to a fifteenth modified example of Embodiment 1, which is an example where the voltage generating circuit 60 shown in the seventh modified example (FIG. 9) is applied to the driver circuit of the thirteenth modified example (FIG. 15). As shown in FIG. 17, in the driver circuit, the drain of the transistor Q5 of the output stage circuit 110 and a gate and a drain of the transistor Q11 are connected to the node N61 of the voltage generating circuit 60. Namely, both the drains of the transistors Q5, Q11 are supplied with substantially 2·VH−2·Vthn from the voltage generating circuit 60.

The transistors Q5, Q6 of the output stage circuit 110 are complementarily (alternately) turned on, and similarly, the transistors Q7, Q8 which are serial-connected to the transistor Q11 are also complementarily (alternately) turned on. Thereby, a direct current does not flow between the drains (node N61) of the transistors Q5, Q11 and the low-side power line 104. Therefore, the output stage circuit 110 can normally operate even with the use of the voltage generating circuit 60, which is a charge pump circuit with a relatively high output impedance, as the high-side power source.

In the present modified example, since the high-side power voltage that is supplied to the output stage circuit 110 increases, the amplitude of the output signal/OUTS and amplitudes of the nodes N7, N4 increase. Also in this case, the voltages of the nodes N7, N4 are raised in rising of the output signal/OUTS, the voltages of the nodes N3, N1 of the input stage circuit 100 is also raised accordingly, and the transistor Q5 operates in the non-saturated region, whereby the H-level voltage of the output signal/OUTS becomes substantially 2·VH−2·Vthn, as is the voltage of the node N61.

Although the voltage generated by the voltage generating circuit 60 is supplied to both the drains of the transistors Q5, Q11 in the present embodiment, the voltage may be supplied only to the drain of the transistor Q11, and the drain of the transistor Q5 may be kept connected to the high-side power line 102 as in FIG. 15. In such a case, although the H-level voltage of the output signal/OUTS becomes the same VH as in the case of FIG. 15, since the gate voltage of the transistor Q5 becomes higher, the rising speed of the output signal/OUTS is improved more than in the case of FIG. 15.

Further, also in the present modified example, the output signal/OUTS or the input signal INS may be supplied to the voltage generating circuit 60 in place of the repeat signal CLK. Since this eliminates the need for supplying the particular repeat signal CLK, the repeat signal input terminal CK and wiring accompanied thereby and the like can be omitted, so as to contribute reduction in footprint of the circuit.

Although not shown, the voltage generating circuit 60 is further applicable to the circuit of FIG. 16 having the feedback push-pull circuit made up of the transistors Q7D, Q8D. Namely, in the output stage circuit 110 of FIG. 16, the drain of the transistor Q5 and the gates and the drains of the transistors Q7D, Q11 may be connected to the node N61 of the voltage generating circuit 60.

Embodiment 2

In Embodiment 2, a driver circuit according to the present invention is described, which was formed by constituting a driver circuit having a similar function to that of Embodiment 1 by the use of p-type transistors.

Figure 18:
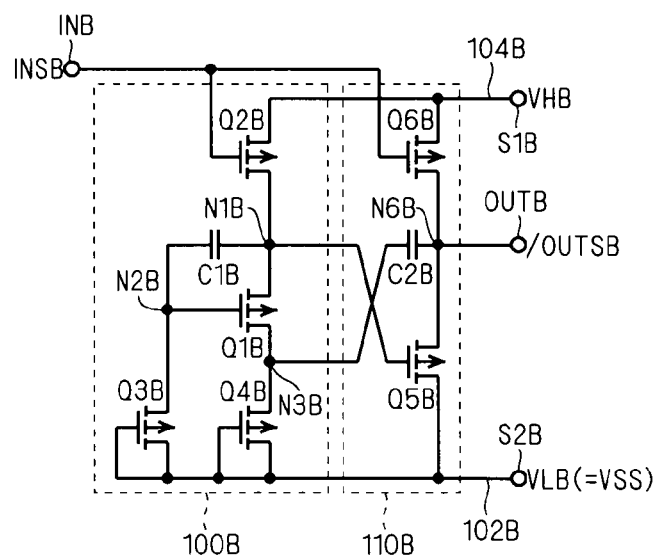
FIG. 18 is a circuit diagram showing a configuration of a driver circuit according to Embodiment 2.

FIG. 18 is a diagram showing a configuration of a driver circuit according to Embodiment 2. The driver circuit is an example of realizing a circuit that functions in a manner similar to the circuit of FIG. 1 by the use of the p-type transistors. Namely, the circuit of FIG. 18 is formed in the circuit of FIG. 1 by using p-type transistors in place of the n-type transistors, reversing the polarities of the power voltages (the low-side power voltage is supplied to the high-side power line 102 and the high-side power voltage is supplied to the low-side power line 104 in FIG. 1), and further reversing the voltage polarity of each signal (the active level is made the L-level and the non-active level is made the H-level). It is to be noted that in FIG. 18, each element corresponding to that shown in the driver circuit of FIG. 1 is provided with the same reference with a letter "B" added thereto.

The driver circuit of FIG. 18 is configured only using p-type transistors, and made up of an input stage circuit 100B and an output stage circuit 110B. An input signal INSB is inputted into an input terminal INB of the input stage circuit 100B, and an output signal/OUTSB obtained by reversing the logic level (H-level, L-level) of the input signal INSB is outputted from an output terminal OUTB provided in the output stage circuit 110B.

This driver circuit is supplied with a voltage VLB as a low-side power source and a voltage VHB as a high-side power source. The low-side power voltage VLB may be the same voltage as the reference voltage GND (=0V) as a reference level of a voltage of each signal, or may be a negative voltage lower than the reference voltage GND. The high-side power voltage VHB is a positive voltage higher than the reference voltage GND.

The driver circuit is capable of outputting, as the output signal/OUTSB, a voltage signal with the low-side power voltage VLB at the L-level and the high-side power voltage VHB at the H-level. On the other hand, the input signal INSB is made a voltage signal with the voltage VMB at the L-level and the voltage VHB at the H-level. Here, a difference between the voltage VMB and the voltage VHB is referred to as VDD. The voltage VDD may be at a level as higher to some degree than threshold voltages of the transistors Q2B, Q6B. Further, the voltage VMB may, for example, be the same voltage as the above-mentioned low-side power voltage VLB. In the actual use, the voltage VLB is set at the same level as the low-side voltage level (voltage VSS) in the case of using the n-type transistors.

When the L-level voltage VMB of the input signal INSB is higher than the L-level voltage VLB of the output signal/OUTSB, the driver circuit operates as a level converting circuit for converting the input signal INSB having the relatively high L-level voltage (VMB) into a L-level voltage (VLB) lower than that.

In the following embodiments, a description is given assuming that the L-level voltage VMB of the input signal INSB is higher than the L-level voltage VLB of the output signal/OUTSB, and the driver circuit also functions as the level converting circuit. Further, for the sake of simplification, it is assumed that the H-level voltage of the input terminal INSB is at the same level as the high-side power voltage VHB of the driver circuit. Moreover, threshold voltages of the respective p-type transistors constituting the driver circuit are all equivalent, and the value thereof is referred to as Vthp.

With reference to FIG. 18 once again, the configuration of the driver circuit according to the present embodiment is described. As described above, the driver circuit is made up of the input stage circuit 100B and the output stage circuit 110B. Each of those circuits is supplied with a power source from a low-side power line 102B and a high-side power line 104B. The low-side power line 102B is supplied with the voltage VLB through a low-side power node S2B, and the high-side power line 104B is supplied with the voltage VHB through a high-side power node S1B.

The input stage circuit 100B is a bootstrap circuit, and configured of p-type transistors Q1B to Q4B and a capacitive element C1B. In the input stage circuit 100B, the transistors Q4B, Q1B, Q2B are serial-connected in this order between the low-side power line 102B and the high-side power line 104B. Here, as in FIG. 18, a connection node between the transistor Q1B and the transistor Q2B is defined as a node N1B, a node connected with a gate of the transistor Q1B is defined as a node N2B, and a connection node between the transistor Q4B and the transistor Q1B is defined as a node N3B.

Namely, the transistor Q4B is connected between the low-side power line 102B and the node N3B, the transistor Q1B is connected between the node N3B and the node N1B, and the transistor Q2B is connected between the node N1B and the high-side power line 104B. A gate of the transistor Q4B is connected to the low-side power line 102B (namely, the transistor Q4B is diode-connected). The capacitive element C1B as a feedback capacitance is connected between the gate of the transistor Q1B (node N2B) and the node N1B, and further, the transistor Q3B with its gate connected to the low-side power line 102B is connected between the node N2B and the low-side power line 102B (namely, the transistor Q3B is diode-connected). A gate of the transistor Q2B is an input node of the driver circuit, and connected to the input terminal INB that receives the input signal INSB. An output node of the input stage circuit 100B is the node N1B.

A circuit made up of the transistors Q1B, Q2B constitute a ratio-type inverter with the input terminal INB used as an input node and with the node NIB used as an output node. Namely, in the inverter, the transistor Q1B is a load element (load transistor), the transistor Q2B is a drive element (drive transistor), and a signal obtained by reversing the logic level of the input signal INSB is outputted to the node N1B. Respective on-resistances of the load transistor Q1B and the drive transistor Q2B are set at an appropriate ratio so that a signal at a predetermined level is obtained at the node N1B.

The output stage circuit 110B has a push-pull circuit made up of the transistors Q5B, Q6B serial-connected between the low-side power line 102B and the high-side power line 104B. When a connection node therebetween is defined to as a node N6B, the transistor Q5B is connected between the low-side power line 102B and the node N6B, and its gate is connected to the node N1B. The transistor Q6B is connected between the node N6B and the high-side power line 104B, and its gate is connected to the input terminal INB. The node N6B is an output node of the push-pull circuit made up of the transistor Q5B, Q6B, as well as the output terminal OUTB of the driver circuit.

The output stage circuit 110B further has a capacitive element C2B connected between the node N6B and the node N3B. This capacitive element C2B capacitively couples the node N6B (output terminal OUTB) and the node N3B, and changes a voltage level of the node N3B in correspondence with a change in voltage level of the node N6B.

As thus described, with an operation of the inverter made up of the transistors Q1B, Q2B, the input signal INSB and the signal of the node N1B come into the relationship in which the logic levels thereof are reversed, and hence the transistor Q5B controlled by a signal of the node N1B and the transistor Q6B controlled by the input signal INSB are complementarily (alternately) turned on. With the transistors Q5B, Q6B controlled in such a manner, the push-pull circuit made up thereof performs a predetermined operation not accompanied by a direct current.

The diode-connected transistor Q3B acts as a unilateral current drive element taking the direction from the node N2B toward the high-side power line 102B as a forward direction. Since the voltage of the low-side power line 102B is VLB, when the transistor Q3B is turned on, the node N2B is discharged to the voltage VLB+Vthp (this Vthp is an absolute value of a threshold voltage of the transistor Q3B). The low-side power voltage VLB is set such that the absolute value of this VLB+Vthp is higher than the absolute value of the threshold voltage of the transistor Q1B. Namely, the transistor Q1B is in the on-state when the voltage of the node N2B is the voltage VLB+Vthp.

In the circuit of FIG. 18, although the transistor Q3B is diode-connected between the low-side power line 102B and the node N2B, it may not have this connecting configuration so long as being able to function as the unilateral current drive element capable of discharging the node N2B to turn on the transistor Q1B in a manner similar to above. For example, a connecting destination of a drain and a gate of the transistor Q3B may be another voltage source that supplies a different voltage from the voltage VLB, or may be a repeat signal source (alternate signal source) as in FIG. 1B of "Low-Power a-Si Level Shifter for Mobile Displays with Bootstrapped Capacitor and Pulsed Signal Source" mentioned above as the non-patent document.

The transistor Q4B acts as a unilateral current drive element taking the direction from the node N3B to the low-side power line 102B as a forward direction, and when turned on, the transistor Q4B discharges the node N3B to the voltage VLB+Vthp (this Vthp is the absolute value of the threshold voltage of the transistor Q4B). By discharging the node N3B, the transistor Q4B supplies the inverter made up of the transistors Q1B, Q2B with a low-side power source.

Figure 19:
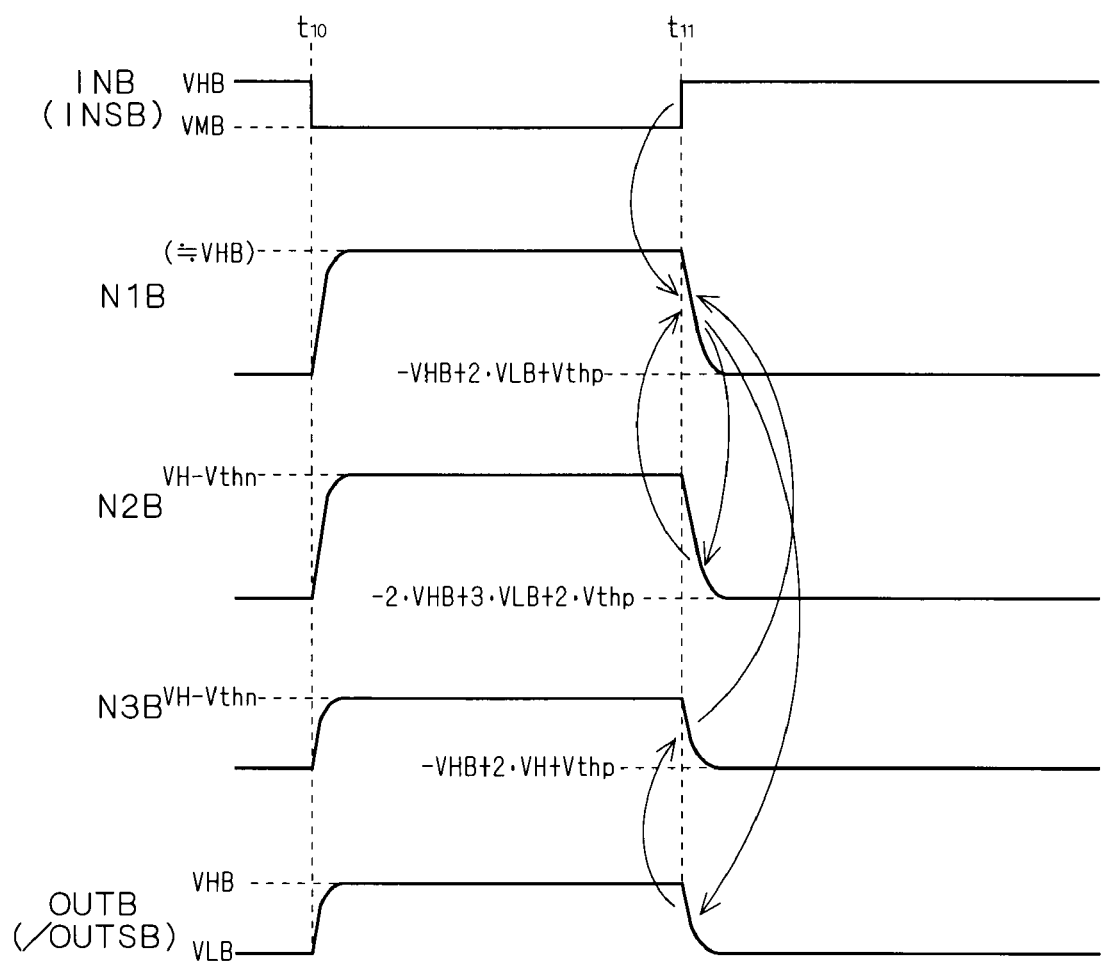
FIG. 19 is a signal waveform diagram showing an operation of the driver circuit according to Embodiment 2.

FIG. 19 is a signal waveform diagram showing an operation of the driver circuit (FIG. 18) of the present embodiment. With reference to FIG. 19, the operation of the driver circuit shown in FIG. 18 is described. It is to be noted that in the following description, so long as not particularly indicated, an influence upon a voltage level of each node caused by a parasitic capacitance and a current driving force (or on-resistance) of the transistor is ignored.

First, as an initial state, the input signal INSB is assumed to be at the H-level (VHB). At this time, the transistors Q2B, Q6B are in the off-state. The nodes N2B, N3B are respectively discharged to the voltage VLB+Vthp by the transistors Q3B, Q4B, respectively, and the transistor Q1B is in the on-state. Therefore, the output node of the inverter made up of the transistors Q1B, Q2B (output node of the input stage circuit 100B) N1B is at the L-level. Accordingly, the transistor Q5B is in the on-state, and the output terminal OUTB (node N6B) of the driver circuit is at the L-level.

When the input signal INSB shifts from this initial state to the L-level of the voltage VMB at time t₀₀, the transistor Q2B is turned on, and the voltage level of the node N1B rises. Although the transistors Q4B, Q1B are both in the on-state at this time, the on-resistance of the transistor Q4B is set sufficiently lower than that of the transistor Q1B, and the voltage level of the node N3B are kept at almost VLB+Vthp.

Further, when the voltage level of the node N1B rises, the voltage level of the node N2B also intends to rise due to the coupling through the capacitive element C1B, but with the transistor Q3B in the on-state, the voltage level of the node N2B is held at VLB+Vthp. Hence, the transistor Q1B is held in the on-state.

The voltage level of the node N1B is a value determined by the ratio of the on-resistances (ratio of current driving forces) of the transistors Q1B, Q2B. The on-resistance of the transistor Q2B is set sufficiently lower than that of the transistor Q1B, and the node N1B is almost at the H-Level of the voltage VHB. Namely, as for an offset voltage at the output node N1B of the input stage circuit 100B can be made almost zero by setting the on-resistance of the transistor Q2B extremely smaller than the on-resistance of the transistor Q1B.

On the other hand, in the output stage circuit 110B, the transistor Q6B is turned on when the input signal INSB shifts to the L-level at the time too, and the voltage level of the output terminal OUTB (node N6B) rises. Further, since the output node N1B of the input stage circuit 100B shifts to the H-level (≈VHB) as described above, a voltage between the gate (node N1B) and the source (node N6B) of the transistor Q5B exceeds the threshold voltage, and the transistor Q5B is turned off. As a consequence, the output terminal OUTB (the output signal/OUTSB) shifts to the H-level of the voltage VHB.

As thus described, when the voltage level of the output terminal OUTB rises, the voltage level of the node N3B also intends to rise due to the coupling through the capacitive element C2B. However, with the transistor Q4B in the on-state, the node N3B is held at the voltage VLB+Vthp.

Then, when the input signal INSB shifts from the L-level (VMB) to the H-level (VHB) at time $t_{11}$, the transistor Q2B is turned off in the input stage circuit 100B, and an electric charge in the node N1B is discharged through the transistors Q1B, Q4B, and the level of the node N1B falls. Accordingly, the transistor Q5B is turned on, and the voltage level of the output terminal OUTB falls.

When the voltage level of the output terminal OUTB falls, the level of the node N3B falls due to the coupling through the capacitive element C2B. Since being diode-connected, the transistor Q4B is turned off when the voltage of the node N3B falls from VLB+Vthp. Further, with the transistor Q1B in the on-state and the transistor Q2B in the off-state, the level of the node N1B further falls with the fall of the voltage level of the node N3B.

As thus described, the fall of the voltage level of the output terminal OUTB caused by turning-on of the transistor Q5B is fed back to the gate (node N1B) of the transistor Q5B. With this positive feedback operation performed, the node N1B reaches such a voltage level as to make the transistor Q5B perform a non-saturated operation, and the output terminal OUTB shifts to the L-level of the voltage VLB. Namely, the L-level of the output signal/OUTSB does not involve a loss corresponding to the threshold voltage of the transistor Q5B.

It should be noted that, when the voltage level of the node N1B falls, the voltage level of the gate (node N2B) of the transistor Q1B also falls due to the coupling through the capacitive element C1B. Since being diode-connected, the transistor Q3B is turned off when the voltage of the node N2B falls from VLB+Vthp, and hence the voltage level of the node N2B further falls.

As thus described, the fall of the voltage level of the node N1B caused by the transistor Q1B discharging the node N1B is fed back to the gate voltage of the transistor Q1B. Namely, the input stage circuit 100B operates as the bootstrap circuit. Therefore, the transistor Q1B is held in the on-state in the non-saturated region even when the voltage level of the node N1B falls, and the positive feedback operation according to the gate voltage of the transistor Q5B is smoothly performed.

As described above, the positive feedback loop according to the gate voltage of the transistor Q5B in the driver circuit is a loop of: (fall of voltage level of the node N1B)→(increase in current flowing through the transistor Q5B)→(fall of voltage level of the output terminal OUTB)→(fall of voltage level of the node N3B)→(increase in current flowing through the transistor Q1B)→(fall of level of the node N1B)→and so on.

The positive feedback operation is described in more detail. First, immediately before the time $t_{11}$ of FIG. 19, the voltage levels of the gate (node N2B) of the transistor Q1B and the node N3B are both VLB+Vthp, the node N1B is almost at the H-level of the voltage VLB, and the output terminal OUTB is at the H-level of the voltage VHB.

When the transistors Q2B, Q6B are turned off at the time $t_{11}$, the level of the node N1B falls. This voltage change of the node N1B is coupled to the node N2B through the capacitive element C1B, and the level of the node N2B falls from VLB+Vthp. The fall of the level of the node N2B leads the transistor Q1B to operate in the non-saturated region, and its drive current to further increase. On the other hand, the fall of the voltage level of the node N1B turns on the transistor Q5B, and the level of the output terminal OUTB falls due to the current flowing through the transistor Q5B.

This change in voltage level of the output terminal OUTB is coupled to the node N3B through the capacitive element C2B, and the level of the node N3B falls from the VLB+Vthp. With the fall of the voltage of the node N3B, namely a drain of the transistor Q1B, the current flowing through the transistor Q1B operating in the non-saturated region increases, and the voltage level of the node N1B further falls. This fall of the level of the node N1B further lowers the voltage level of the gate of the transistor Q5B, and the current flowing through the transistor Q5B further increases, leading to further fall of the level of the output terminal OUTB.

With repetition of this positive feedback operation, the voltage level of the gate (node N1B) of the transistor Q5B sufficiently falls, and the transistor Q5B starts operating in the non-saturated region. Thereby, the ultimate value of the L-level voltage of the output signal/OUTSB becomes the voltage VLB without involving a loss corresponding to the threshold voltage of the transistor Q5B.

As thus described, according to the driver circuit of the present embodiment, in the output stage circuit 110B, the transistor Q5B is turned on in accordance with the fall of the voltage level of the node N1B of the input stage circuit 100B, to lower the voltage level of the output terminal OUTB. The transistor Q5B positively feeds back an amount corresponding to the voltage fall of the output terminal OUTB to its own gate voltage, thereby to operate in the non-saturated region. Therefore, when the output terminal OUTB (output signal/OUTSB) is set at the L-level, it is possible to lower the output terminal OUTB to the voltage VLB without involving a loss corresponding to the threshold voltage of the transistor Q5B, and its falling speed is high.

Further, at that time, when lowering the voltage level of the node N1B, the transistor Q1B of the input stage circuit 100B also positively feeds back an amount corresponding to the voltage fall to its own gate, thereby to operate in the non-saturated region (bootstrap action). Therefore, the voltage level of the node N1B does not involve a loss corresponding to the threshold voltage of the transistor Q1B, and its falling speed is high. Namely, the input stage circuit 100B lowers the gate voltage of the transistor Q5B at high speed, thereby to contribute to an increase in falling speed of the output signal/OUTSB.

MODIFIED EXAMPLE

Although the example was shown above where the driver circuit having a similar function to the circuit of FIG. 1 was configured using the p-type transistors, the present embodiment is also applicable to the circuits of the respective modified examples (FIGS. 3 to 17) of Embodiment 1.

Namely, in the circuits of FIGS. 3 to 17, the p-type transistors are used in place of the n-type transistors, the polarities of the power voltages are reversed (the low-side power voltage VLB is supplied to the high-side power line 102 and the high-side power voltage VHB is supplied to the low-side power line 104 in each figure), and the voltage polarity of each signal is reversed (the active level is made the L-level and the non-active level is made the H-level), so that driver circuit having similar functions to those circuits can be configured using p-type transistors (not shown).

Embodiment 3

In the driver circuit of Embodiment 1, the transistor Q6 for discharging the output terminal OUT (generating the falling of the output signal/OUTS) was driven by the input signal INS. However, in the case of using the driver circuit as the level converting circuit, the case of the input signal INS having a small amplitude is considered, and in such a case, it is feared that the on-resistance of the transistor Q6 cannot be made sufficiently small, and the discharging speed of the output terminal OUT (the falling speed of the output signal/OUTS) may slow down.

Even when the input signal INS has a small amplitude, it is necessary to make a gate width of the transistor Q6 large in order to keep discharging of the output terminal OUT at high speed. However, when the gate width of the transistor Q6 is increased, it involves an increase in footprint of the circuit. Further, since a gate capacitance of the transistor Q6 increases, an input capacitance value of the input terminal IN increases, and in a case where the circuit for generating the input signal INS has a small driving ability, the rising speed of the input signal INS itself slows down, and it is thus considered that it may result in prevention of acceleration of the operation.

Here, in Embodiment 3, a driver circuit is provided which is capable of charging/discharging the output terminal OUT at high speed while suppressing an increase in footprint of the circuit even in the case of the input signal INS having a small amplitude.

Figures 20, 21:
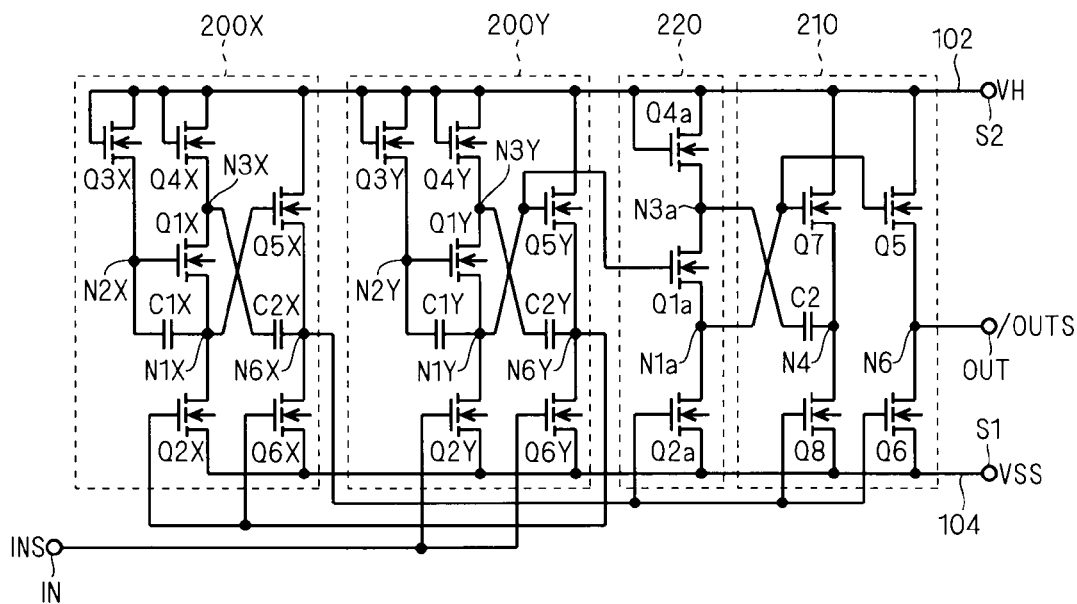
FIG. 20 is a circuit diagram showing a configuration of a driver circuit according to Embodiment 3.
FIG. 21 is a circuit diagram showing a modified example of the driver circuit according to Embodiment 3.

FIG. 20 is a circuit diagram showing a configuration of the driver circuit according to Embodiment 3. As in the figure, the driver circuit is configured of two input stage circuits 200X, 200Y, a step-up push-pull circuit 220, and an output stage circuit 210.

Each of the input stage circuits 200X, 200Y has the same configuration as in the driver circuit according to Embodiment 1 and its modified examples. Although FIG. 20 shows an example of the input stage circuits 200X, 200Y each having the configuration in the driver circuit of FIG. 1, the driver circuit of any of the above-mentioned modified examples may naturally be applied. It is to be noted that in the input stage circuits 200X, 200Y of FIG. 20, each element corresponding to that shown in the driver circuit of FIG. 1 is provided with the same reference with a letter "X" of "Y" added thereto.

In the present embodiment, the input signal INS is inputted into an input node of the input stage circuit 200Y, whereas a signal (first internal signal) of a node N6Y of the input stage circuit 200Y is inputted into an input node of the input stage circuit 200X. Namely, the input stage circuit 200Y is driven by the input signal INS, and the input stage circuit 200X is driven by the signal of the node N6Y of the input stage circuit 200Y.

The step-up push-pull circuit 220 is one similar to the step-up push-pull circuit 120 of FIG. 11 or the multistage step-up push-pull circuit 120a of FIG. 12. When the step-up push-pull circuit 220 is the step-up push-pull circuit 120 of FIG. 11, the capacitive element C1a is omitted. Further, when the step-up push-pull circuit 220 is the multistage step-up push-pull circuit 120a, the front-stage capacitive element C1a1 is omitted. FIG. 20 shows an example where the step-up push-pull circuit 220 is made up of one unit circuit as is the step-up push-pull circuit 120 of FIG. 11.

A signal of a node N1Y of the input stage circuit 200Y is inputted into a gate of the transistor Q1a that charges the node N1a of the step-up push-pull circuit 220. A signal (second internal signal) of a node N6X of the input stage circuit 200X is inputted into a gate of the transistor Q2a that discharges the node N1a.

Further, the output stage circuit 210 has the same configuration as that of the output stage circuit 110 of the driver circuit according to each of Embodiment 1 and its modified examples. Although FIG. 20 shows an example of the output stage circuit 210 having the configuration of the output stage circuit 110 of FIG. 3, the output stage circuit 110 of any of the above-mentioned modified examples may naturally be applied.

The signal of the output node N1a of the step-up push-pull circuit 220 is inputted into both gates of the transistors Q7, Q5 that respectively charge the node N4 of the output stage circuit 210 and the output terminal OUT (node N6), and the signal of the node N6X of the input stage circuit 200X is inputted into both gates of the transistors Q8, Q6 that respectively discharge the node N4 and the output terminal OUT.

Since the driver circuit of Embodiment 1 functions as the inverter that outputs a signal obtained by reversing the logic level of a signal of its input node, the signals of the nodes N1Y, N6Y of the input stage circuit 200Y in FIG. 20 are at the opposite logic level to the logic level of the input signal INS, and the signal of the node N6X of the input stage circuit 200X is at the same logic level as the logic level of the input signal INS. Therefore, logic operations of the step-up push-pull circuit 220 and the output stage circuit 210 are respectively the same as the operations of the step-up push-pull circuit 120 (or the multistage step-up push-pull circuit 120a) and the output stage circuit 110 in the driver circuit of Embodiment 1. Therefore, as in the case of Embodiment 1, the output signal/OUTS obtained by reversing the logic level of the input signal INS is outputted from the output terminal OUT.

Here, the driver circuit of Embodiment 1 also functions as a level converting circuit that converts a signal with its H-level voltage being VDD to a signal with its H-level voltage being VH. Therefore, the H-level voltage and the L-level voltage of the signals of the nodes N1Y, N6Y of the input stage circuit 200Y and the signal of the node N6X of the input stage circuit 200X in FIG. 20 become VH and VSS, respectively, regardless of the amplitude of the input signal INS. Further, due to the predetermined positive feedback operation described in Embodiment 1, the rising speeds of those nodes N1Y, N6Y, N6X are high.

Especially in the driver circuit of FIG. 20, the transistor Q6 for discharging the output terminal OUT (generating the falling of the signal/OUTS) is driven not by the input signal INS, but by the signal with its H-level voltage converted to VH and its L-level voltage to VSS (signal of the node N6X of the input stage circuit 200X). Therefore, even in the case of the INS having a small amplitude, the gate-source voltage of the transistor Q6 can be increased to make the on-resistance sufficiently small, so as to discharge the output terminal OUT (generate the falling of the output signal/OUTS) at high speed. Namely, it is possible to prevent a decrease in discharging speed of the output terminal OUT in the case of the INS having a small amplitude without increasing the gate width of the transistor Q6, so as to contribute reduction in foot print of the circuit.

Naturally, the charging speed of the output terminal OUT (rising speed of the output signal/OUTS) is high as described in Embodiment 1. In the present embodiment, in addition to that, the discharging speed thereof is also high, and it is thus possible to accelerate the operation more than the driver circuit of Embodiment 1.

MODIFIED EXAMPLE

Although the driver circuit was shown in FIG. 20 which generates an output signal (/OUTS) (of the opposite phase) obtained by reversing the logic level of the input signal (INS) as in Embodiment 1, the present embodiment is applicable to one that generates an output signal (of the same phase) taking the same logic level as the logic level of the input signal. Here, such modified examples are shown.

FIG. 21 is a circuit diagram showing a configuration of a driver circuit according to a first modified example of Embodiment 3. The driver circuit is configured of the two input stage circuits 200X, 200Y, the step-up push-pull circuit 220 and the output stage circuit 210, as in FIG. 20.

However, in the present embodiment, the input signal INS is inputted into the input node of the input stage circuit 200X, and the signal of the node N6X of the input stage circuit 200X is inputted into the input node of the input stage circuit 200Y. Namely, in the present modified example, the input stage circuit 200X is driven by the input signal INS, and the input stage circuit 200Y is driven by the signal of the node N6X of the input stage circuit 200X. That is, in the input stage circuits 200X, 200Y, the side to drive and the side to be driven have been interchanged with each other as compared with the case of FIG. 20. In other words, in the present modified example, the signal of the node N6X becomes the first internal signal, and the signal of the node N6Y becomes the second internal signal.

However, the connecting relation among the input stage circuits 200X, 200Y, the step-up push-pull circuit 220 and the output stage circuit 210 is similar to that in FIG. 20. Namely, the signal of the node N1Y of the input stage circuit 200Y is inputted into the gate of the transistor Q1a that charges the node N1a of the step-up push-pull circuit 220, and the signal of the node N6X of the input stage circuit 200X is inputted into the gate of the transistor Q2a that discharges the node N1a. Further, the signal of the node N6X of the input stage circuit 200X is inputted into both gates of the transistors Q8, Q6 that respectively discharge the node N4 of the output stage circuit 210 and the output terminal OUT (node N6).

According to the configuration of FIG. 21, the signal of the node N1Y of the input stage circuit 200Y is at the same logic level as the logic level of the input signal INS, and the signals of the node N6X of the input stage circuit 200X is at an opposite logic level to the input signal INS. Therefore, the logic operations of the step-up push-pull circuit 220 and the output stage circuit 210 are respectively opposite to those in the case of FIG. 20. Therefore, the output signal OUTS that takes the same logic level as the input signal INS is outputted from the output terminal OUT.

Also in the driver circuit of FIG. 21, the transistor Q6 for discharging the output terminal OUT (generating the falling of the signal/OUTS) is driven not by the input signal INS, but by the signal with its H-level voltage converted to VH and its L-level voltage to VSS (signal of the node N6X of the input stage circuit 200X). Therefore, even in the case of the INS having a small amplitude, the output terminal OUT can be discharged at high speed. Namely, it is possible to prevent a decrease in discharging speed of the output terminal OUT in the case of the INS having a small amplitude without increasing the gate width of the transistor Q6, so as to contribute reduction in foot print of the circuit.

Naturally, the charging speed of the output terminal OUT (rising speed of the output signal OUTS) is high as described in Embodiment 1. In the present embodiment, in addition to that, the discharging speed thereof is also high, and it is thus possible to accelerate the operation more than the driver circuit of Embodiment 1.

Embodiment 4

A driver circuit according to the present embodiment can also be configured by applying the above-mentioned Embodiment 2, by the use of p-type transistors. Namely, in the circuit of the present embodiment, p-type transistors may be used in place of the n-type transistors, the polarities of the power voltages may be reversed, and the voltage polarity of each signal may be reversed (the active level is made the L-level and the non-active level is made the H-level).

Figure 22:
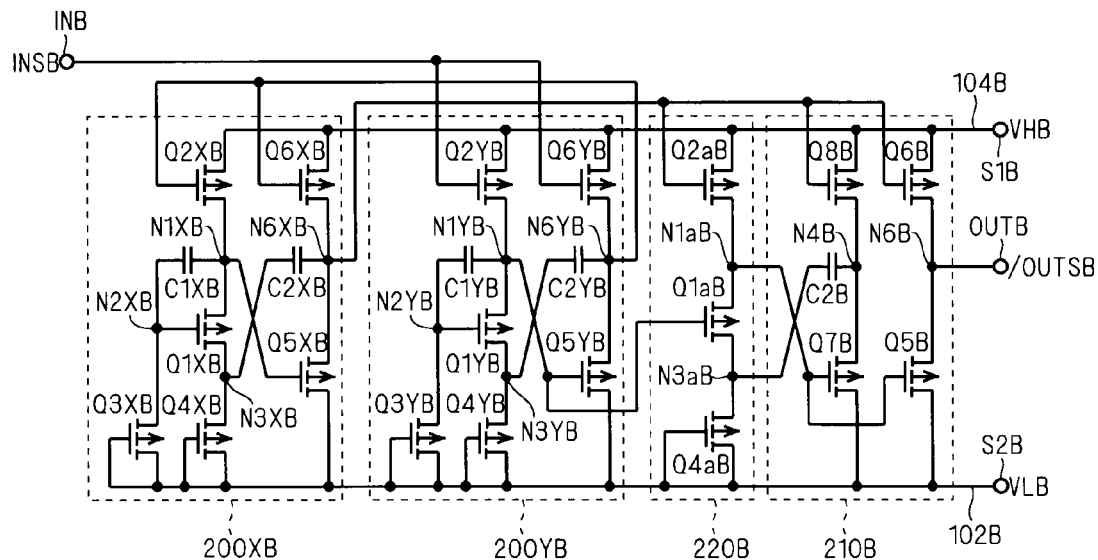
FIGS. 22 and 23 are circuit diagrams showing configurations of driver circuits according to Embodiment 4.
Figure 23:
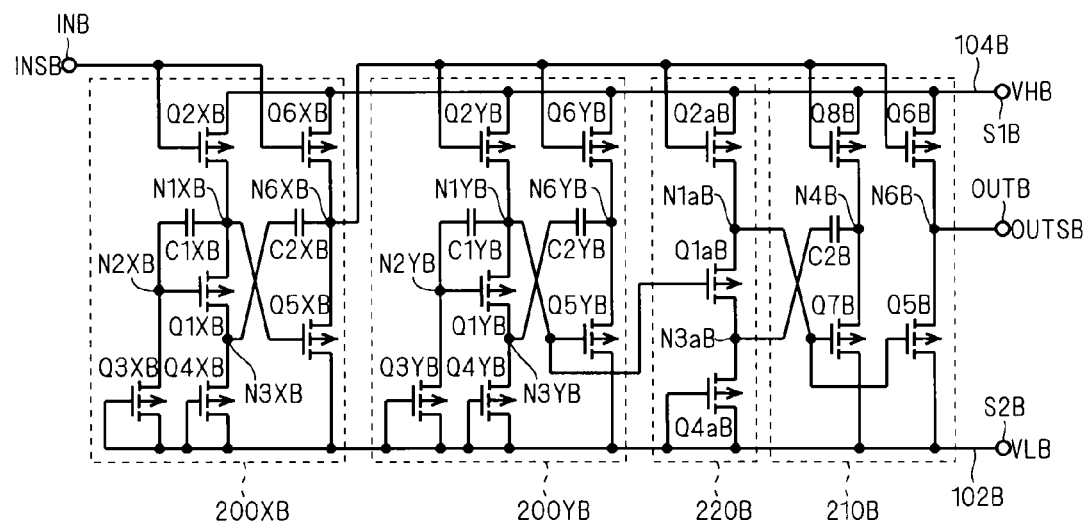

For example, in the case that p-type transistors are used to configure the driver circuit according to FIG. 20, a driver circuit in FIG. 22 is obtained. In the case that p-type transistors are used to configure the driver circuit according to FIG. 21, a driver circuit in FIG. 23 is obtained. It is to be noted that in FIGS. 22 and 23, each element corresponding to that shown in the driver circuit of FIGS. 20 and 21 are provided with the same reference with a letter "B" added thereto.

Embodiment 5

The driver circuit described in each of the above-mentioned embodiments has a high driving ability and is thus capable of driving a load capacitance at high speed, but it includes the ratio-type circuit in which a direct current (through current) flows between the high-side power source and the low-side power source. In the ratio-type circuit, a larger load capacitance can be driven at high speed by increasing the driving ability of the transistor constituting the circuit, but there involves a problem in that the through current increases to increase power consumption with decrease in on-resistance of the transistor. Therefore, there is a limit in enhancing the driving ability of the ratio-type circuit itself from the view point of reduction in power consumption.

Hence in the driver circuit including the ratio-type circuit, it is preferable to drive the load capacitance through a low-power output stage circuit with high driving ability, rather than directly driving the load capacitance by means of the ratio-type circuit as in Embodiments 1 to 3. In the present embodiment, an example of applying the present invention to an output stage circuit capable of further suppressing power consumption is shown.

Figure 24:
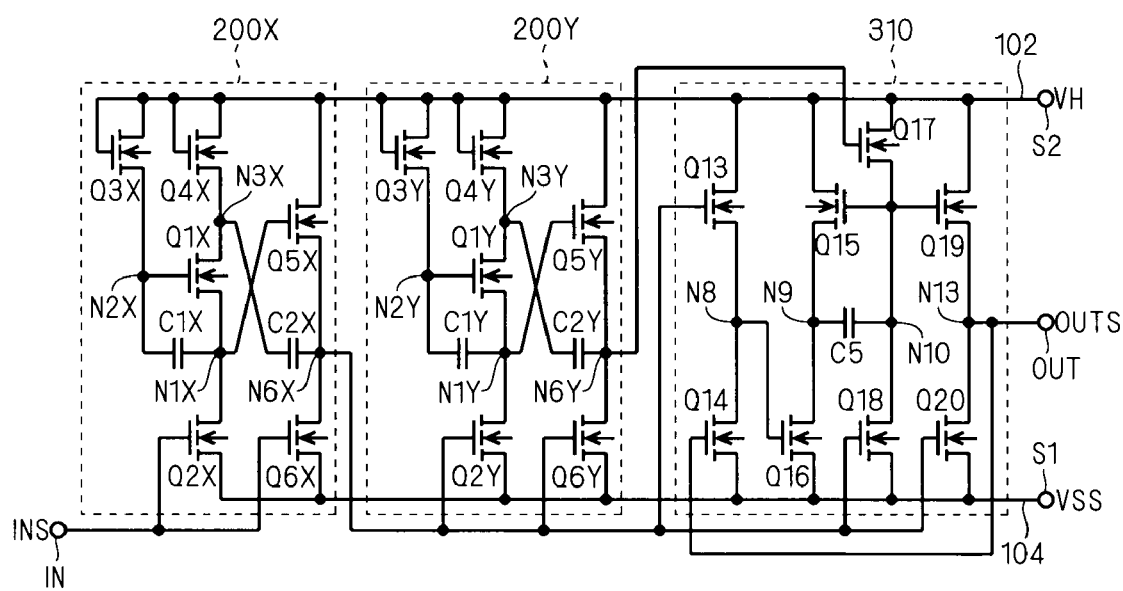
FIG. 24 is a circuit diagram showing a modified example of a driver circuit according to Embodiment 5.

FIG. 24 is a diagram showing a configuration of a driver circuit according to Embodiment 5. The driver circuit is made up of the two input stage circuits 200X, 200Y, and an output stage circuit 310. The input stage circuits 200X, 200Y are respectively the same as those of Embodiment 3. Namely, those circuits have the same configurations as in the driver circuit according to Embodiment 1 and its modified examples.

In the present embodiment, the input signal INS is inputted into the input node of the input stage circuit 200X, and the signal (first internal signal) of the node N6X of the input stage circuit 200X is inputted into the input node of the input stage circuit 200Y. Namely, the input stage circuit 200X is driven by the input signal INS, and the input stage circuit 200Y is driven by the signal of the node N6X of the input stage circuit 200X.

Since the input stage circuits 200X, 200Y respectively function as inverters for outputting signals obtained by reversing the respective logic levels of signals of the input nodes thereof, an output signal of the input stage circuit 200X (signal of the node N6X) of FIG. 24 is set at an opposite logic level to the input signal INS, and an output signal of the input stage circuit 200Y [signal of the node N6Y (second internal signal)] is set at the further opposite logic level thereto, namely the same logic level as the input signal INS. However, due to a signal delay in the input stage circuit 200Y, the level change of the output signal of the input stage circuit 200Y occurs after a slight delay from the level change of the input stage circuit 200X.

The output stage circuit 310 is a low-power ratioless-type driver circuit with high driving ability, and a similar circuit to this is disclosed in FIG. 2 of U.S. Pat. No. 3,898,479. In more detail, it is a circuit excluding portions of transistors Q13 to Q15 and a capacitive element 54 (those portions are an input stage circuit of the boot-strap type circuit) in the FIG. 2 mentioned above.

The output stage circuit 310 is made up of n-type transistors Q13 to Q20 and a capacitive element C5. The transistors Q13, Q14 are serial-connected between the high-side power line 102 and the low-side power line 104. When a connection node between the transistors Q13, Q14 is defined as a node N8, a gate of the transistor Q13 connected between the high-side power line 102 and the node N8 is connected to the node N6X of the input stage circuit 200X. Further, a gate of the transistor Q14 connected between the node N8 and the low-side power line 104 is connected to the output terminal OUT (node N13) of the driver circuit. Namely, the transistor Q13 serves to charge the node N8 with a current from the high-side power line 102 in accordance with a voltage level of the node N6X (output signal of the input stage circuit 200X), and the transistor Q14 serves to discharge electric charge of the node N8 to the low-side power line 104 in accordance with a voltage level of the output terminal OUT (output signal OUTS).

The transistors Q17, Q18 are also serial-connected between the high-side power line 102 and the low-side power line 104. When a connection node between the transistors Q17, Q18 is defined as a node N10, a gate of the transistor Q17 connected between the high-side power line 102 and the node N10 is connected to the node N6Y of the input stage circuit 200Y. Namely, the transistor Q17 serves to charge the node N10 with a current from the high-side power line 102 in accordance with a voltage level of the node N6Y (output signal of the input stage circuit 200Y). On the other hand, a gate of the transistor Q18 connected between the node N10 and the low-side power line 104 is connected to the node N6X of the input stage circuit 200X. Namely, the transistor Q18 serves to discharge electric charge of the node N10 to the low-side power line 104 in accordance with the voltage level of the node N6X.

Similarly, the transistors Q15, Q16 are also serial-connected between the high-side power line 102 and the low-side power line 104. When a connection node between the transistors Q15, Q16 is defined as a node N9, a gate of the transistor Q15 connected between the high-side power line 102 and the node N9 is connected to the node N10, and a gate of the transistor Q16 connected between the node N9 and the low-side power line 104 is connected to the node N8. Further, the capacitive element C5 is connected between the node N9 and the node N10. Namely, the transistor Q15 serves to charge the node N9 with a current from the high-side power line 102 in accordance with a voltage level of the node N10, and the transistor Q16 serves to discharge electric charge of the node N9 to the low-side power line 104 in accordance with the voltage level of the node N8.

Further, the transistors Q19, Q20 are also serial-connected between the high-side power line 102 and the low-side power line 104. The connection node N13 between the transistors Q19, Q20 is the output terminal OUT of the driver circuit, and the output signal OUTS is outputted therefrom. A gate of the transistor Q19 connected between the high-side power line 102 and the output terminal OUT is connected to the node N10, and a gate of the transistor Q20 connected between the output terminal OUT and the low-side power line 104 is connected to the node N6X of the input stage circuit 200X. Namely, the transistor Q19 serves to charge the output terminal OUT with a current from the high-side power line 102 in accordance with a voltage level of the node N10, and the transistor Q20 serves to discharge electric charge of the node N9 to the low-side power line 104 in accordance with the voltage level of the node N6X.

In the output stage circuit 310, as its operation is detailed below, a through current path from the high-side power line 102 to the low-side power line 104 is shut down through the use of a delay in voltage change of each node, and current consumption is thereby suppressed. Further, due to the operation of the output stage circuit 310, the output signal OUTS accurately changes between the voltages VH and VSS.

Figure 25:
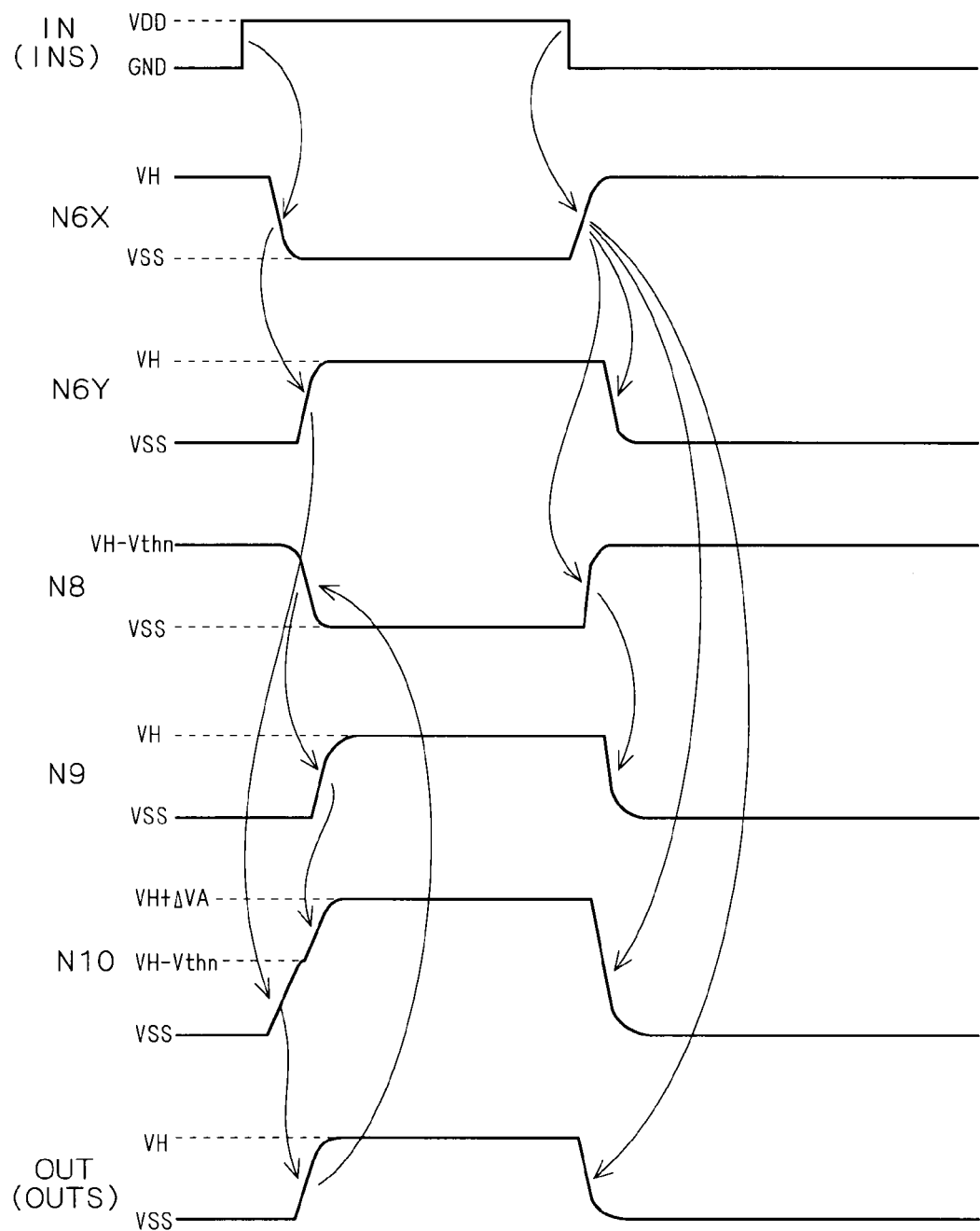
FIG. 25 is a signal waveform diagram showing an operation of the driver circuit according to Embodiment 5.

FIG. 25 is a signal waveform diagram showing an operation of the driver circuit (FIG. 24) according to the present embodiment. In the following, the operation of the driver circuit is described with reference to FIG. 25. It should be noted that, since operations of the input stage circuits 200X, 200Y are the same as in the driver circuit of Embodiment 1 (FIG. 1), detailed descriptions thereof are omitted here.

First, as an initial state, a state where the input signal INS to be supplied to the input terminal IN is at the L-level of the voltage VSS is assumed. The node N6X of the input stage circuit 200X is at the H-level (VH), and the node N6Y of the input stage circuit 200Y is at the L-level (VSS). Therefore, the transistors Q13, Q18, Q20 of the output stage circuit 310 are in the on-state, and the transistor Q17 is in the off-state. Thus, the node N10 is at the L-level (VSS), and the transistors Q15, Q19 are in the off-state. Hence the output terminal OUT is at the L-level (VSS), and the transistor Q14 is in the off-state. Since the node N8 is at the H-level (VH−Vthn) and the transistor Q16 is in the on-state, the node N9 is at the L-level (VSS).

When the input signal INS shifts from this initial state to the H-level of the voltage VDD, the node N6X of the input stage circuit 200X shifts to the L-level with the voltage VSS. Since the signal of the node N6X is inputted into the input stage circuit 200Y, the node N6Y of the input stage circuit 200Y shifts to the H-level of the voltage VH, following the shift of the node 6X to the L-level.

Then, in the output stage circuit 310, the following operation is performed. First, when the node N6X of the input stage circuit 200X shifts to the L-level (VSS), the transistors Q13, Q18, Q20 are turned off. At this time, the output terminal OUT is still at the L-level (VSS), and thereby, the transistor Q14 is also in the off-state. Therefore, even when the transistor Q13 is turned off, the node N8 is in a floating state, and held at the H-level of the VH−Vthn.

Further, since the node N6Y of the input stage circuit 200Y shifts to the H-level (VH), the transistor Q17 is turned on, to charge the node N10, and its voltage level rises. As thus described, the voltage change of the node N6Y occurs in accordance with the voltage change of the node N6X, and thereby in charging of the node N10, the transistor Q18 is turned off before the transistor Q17 is turned on. This prevents generation of a through current flowing through the transistors Q17, Q18 as its paths.

Although the node N10 is capacitively coupled with the node N9 through the capacitive element C5, since the node N8 is held at the H-level and the transistor Q16 is in the on-state at this time, the node N9 is held at the L-level of almost the voltage VSS even when the voltage level of the node N10 rises. Further, when the charging of the node N10 proceeds and a voltage between the nodes N10, N9 exceeds a threshold voltage of the transistor Q15, the transistor Q15 is turned on, but an on-resistance of the transistor Q15 is set sufficiently larger than that of the transistor Q16, and also at this time, the node N9 is held at the L-level of almost the voltage VSS. As a consequence, the node N10 shifts to the H-level of the voltage VH−Vthn.

When the node N10 shifts to the H-level (VH−Vthn), the transistor Q19 is turned on, the output terminal OUT is charged, and its voltage level rises. Even at this time of charging the output terminal OUT, the transistor Q20 is turned off before the transistor Q19 is turned on. This prevents generation of a through current passing the transistors Q19, Q20 as paths.

When the charging of the output terminal OUT proceeds, the transistor Q14 is turned on, and the node N8 is discharged to shift to the L-level (VSS). Since the transistor Q16 is turned off accordingly, the node N9 is charged through the transistor Q15, and the voltage level rises. Since this rise of the voltage level of the node N9 is transmitted to the node N10 through the capacitive element C5, the voltage level of the node N10 also rises. When the voltage level of the node N10 rises, the transistor Q17 comes into the off-state and the node N10 comes into a floating state, and thereby, the voltage level of the node N10 further rises, to be a voltage VH+ΔVA higher than the voltage VH (ΔVA is determined by a voltage change amount of the node N9 and a ratio of a parasitic capacitance attached to the node N10 and a capacitance value of the capacitive element C5.)

As thus described, when the transistor Q19 is turned on to activate the output signal/OUTS, the circuit made up of the transistors Q13 to Q16 raises the voltage level of the node N9, to raise the voltage level of the node N10. Thereby, a gate-source voltage of the transistor Q19 is raised. Namely, the circuit made up of the transistors Q13 to Q16 constitutes a step-up circuit that operates based upon the output signal OUTS, and raises the gate-source voltage of the transistor Q19 in activation of the output signal OUTS.

As thus described, in the output stage circuit 310, when the voltage level of the output terminal OUT rises by the transistor Q19 charging the output terminal OUT, the bootstrap effect of feeding back the rise of the voltage to the node N10 (gate of the transistor Q19) is obtained. This leads to the rise of the voltage level of the node N10, whereby the transistor Q19 has increased current driving force, and performs a non-saturated operation. Accordingly, the output terminal OUT is charged at high speed, to shift to the H-level of VH.

It is to be noted that, since the transistor Q15 also performs the non-saturated operation at this time, the voltage level of the node N9 becomes VH. As thus described, the transistor Q15 is turned on upon charging of the node N10, and the transistor Q16 is turned off thereafter by discharging of the node N8. Namely, the transistor Q15 is turned on before the transistor Q16 is turned off, and hence during that time, a through current flows through the transistors Q15, Q16. However, making current driving force of the transistors Q15, Q16 sufficiently small can prevent an increase in power consumption.

Further, the period during which the through current is generated is only a short period from turning-on of the transistor Q19 along with the transistor Q15 to charging of the output terminal OUT to shift to the H-level. The larger the current driving force of the transistor Q19, the shorter the period can be made and the smaller the power consumption due to the through current can be made. Especially when a load capacitance applied to the output terminal OUT is large, the current driving force of the transistor Q19 is desirably set sufficiently large in order to prevent the output terminal OUT from taking time for charging. Since the output stage circuit 310 is the ratioless-type circuit, and a through current is not generated therein in a steady state, even when the current driving force of the transistor Q19 is set large, it does not involve an increase in power consumption in the steady state.

With reference to FIGS. 24 and 25 again, when the input signal INS shifts from the H-level (VDD) to the L-level (GND), the node N6X of the input stage circuit 200X shifts to the H-level of the voltage VH. Further, accordingly, the node N6Y of the input stage circuit 200Y shifts to the L-level (VSS).

At this time, in the output stage circuit 310, the transistors Q18, Q20 are turned on with the node N6X having shifted to the H-level, and the transistor Q17 is turned off with the node N6Y having shifted to the L-level. Hence the node N10 and the output terminal OUT are discharged. Since the transistors Q19, Q15 are turned off when the node N10 shifts to the L-level, the output signal OUTS shifts to the L-level of the voltage VSS.

Further, since the transistor Q13 has already been turned on at the time of shifting of the node N6X to the H-level, the output terminal OUT shifts to the L-level, and when the transistor Q14 is turned off, the node N8 is charged to shift to the H-level of the voltage VH−Vthn. Accordingly, the transistor Q16 is turned on, and the node N9 shifts to the L-level of the voltage VSS.

In this charging of the node N8, the transistor Q13 is turned on before the transistor Q14 is turned off, and hence a through current flows through the transistors Q13, Q14 during the time period from turning-on of the transistor Q13 to turning-off of the transistor Q14. However, since the output terminal OUT is discharged at high speed to shift to the L-level (VSS), that time period is very short and the amount of the through current is just a tiny amount. Further, in discharging of the node N9, the transistor Q15 is turned off before the transistor Q16 is turned on, and hence a through current is not generated through the transistors Q15, Q16.

By the operations as thus described, the driver circuit returns to the above-mentioned initial state. Thereafter, the operations described above are repeated in accordance with the level change of the input signal INS.

It is to be noted that in the steady state, the through current path from the high-side power line 102 to the low-side power line 104 does not exist in the output stage circuit 310. Therefore, the driving abilities of the transistors Q19, Q20 can be set large, so as to charge/discharge the output terminal OUT at high speed to change the level of the output signal OUTS at high speed even in the case of a large output load capacitance of the output terminal OUT.

In the circuit of FIG. 24, the input stage circuit 200X drives the transistors Q2Y, Q6Y, Q13, Q18, Q20, and the input stage circuit 200Y drives the transistor Q17. Typically, a gate capacitance value of each of these transistors is an order of magnitude small as compares with a capacitance value of a load capacitance connected to the output terminal OUT, individual driving abilities of the input stage circuits 200X, 200Y may be an order of magnitude small as compared with the driving ability of the output stage circuit 310. Namely, in the present embodiment, the power consumption of the input stage circuits 200X, 200Y including the ratio-type circuit can be set extremely smaller than in the driver circuit of Embodiment 1.

As thus described, in the driver circuit of the present embodiment, based upon the output signals of the input stage circuits 200X, 200Y (signals of the node N6X, 6Y) which consume extremely lower power than the driver circuit of Embodiment 1, the output stage circuit 310 as the low-power ratioless-type bootstrap circuit in which a through current is not generated in a steady state is driven, to generate the output signal OUTS. Since the through current is not generated in the output stage circuit 310 in the steady state, driving power is not restricted for suppressing the through current, and hence its driving ability can be set high. It is thus possible to realize a low-power driver circuit with high driving ability.

FIRST MODIFIED EXAMPLE

Figure 26:
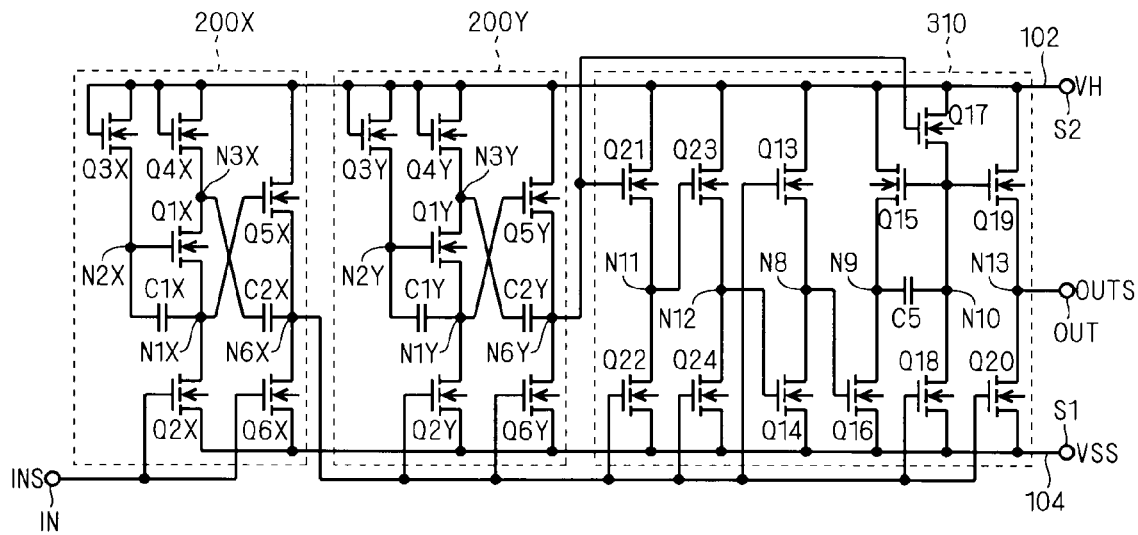
FIG. 26 is a circuit diagram showing a first modified example of a driver circuit according to Embodiment 5.

FIG. 26 is a circuit diagram of a driver circuit according to a first modified example of Embodiment 5. The driver circuit is formed by providing the output stage circuit 310 with a delay circuit made up of transistors Q21 to Q24 in the circuit of FIG. 24. In the present modified example, this delay circuit functions as a step-up circuit for raising a gate-source voltage of the transistor Q19 in activation of the output signal OUTS.

As thus described, in the circuit of FIG. 24, in charging of the output terminal OUT (generating the rising of the output signal OUTS) by the transistor Q19, the voltage level of the node N9 rises after a delay from the shift of the node N10 (gate of the transistor Q19) to the H-level (VH−Vthn). At this time, due to the coupling between the nodes N9, N10 through the capacitive element C5, the H-level voltage of the node N10 is raised to a sufficiently high voltage level (voltage VH+ΔVA shown in FIG. 25), and the transistor Q19 comes to operate in the non-saturated region. Namely, it is necessary to hold a certain period of delay time between the rising of the voltage level of the node N9 and the rising of the voltage level of the node N10.

In the circuit of FIG. 24, the rise of the output signal OUTS after a delay from the shift of the voltage level of the node N10 (gate of the transistor Q19) is used for holding the above-mentioned delay time. Namely, in the circuit of FIG. 24, with the use of the output signal OUTS that rises after the shift of the voltage level of the N10 to the H-level, the transistor Q14 is turned on, and thereby, the transistor Q16 is turned off, to raise the voltage level of the node N9.

As opposed to this, in the circuit of FIG. 26, the delay time is made by means of the delay circuit made up of the transistors Q21 to Q24. The transistors Q21, Q22 are serial-connected between the high-side power line 102 and the low-side power line 104. When a connection node therebetween is defined as a node N11, a gate of the transistor Q21 between the high-side power line 102 and the node N11 is connected to the node N6Y of the input stage circuit 200Y, and a gate of the transistor Q22 between the node N11 and the low-side power line 104 is connected to the node N6X of the input stage circuit 200X.

Similarly, the transistors Q23, Q24 are also serial-connected between the high-side power line 102 and the low-side power line 104. When a connection node therebetween is defined as a node N12, a gate of the transistor Q21 between the high-side power line 102 and the node N11 is connected to the node N11, and a gate of the transistor Q22 between the node N11 and the low-side power line 104 is connected to the node N6X of the input stage circuit 200X. In the present modified example, the gate of the transistor Q14 is connected to a node N12 as an output node of the delay circuit.

In the delay circuit, when the signal of the node N6Y of the input stage circuit 200Y rises (the transistors Q22, Q24 are in the off-state at this time), the transistor Q21 is turned on and the node N11 shifts to the H-level. Accordingly, the transistor Q23 is turned on and the node N12 shifts to the H-level. Namely, the node N12 shifts to the H-level at the timing delayed from the shift of the signal of the node N6Y to the H-level by just a period of time required for charging the nodes N11, N12. When the node N12 shifts to the H-level, the transistor Q14 is turned on, whereby the transistor Q16 is turned off and the voltage level of the node N9 rises.

As thus described, the delay circuit makes the transistor Q14 turned on after a delay of a certain period of time from the rising of the node N6Y. As a consequence, a certain degree of delay time is held between the rising of the voltage level of the node N9 and the rising of the voltage level of the node N10 in the output stage circuit 310. Therefore, the drive circuit of FIG. 27 operates in a similar manner to the circuit of FIG. 24, and can obtain a similar effect thereto.

Further, in the circuit of FIG. 24, the rising speed of the output signal OUTS may change under the influence of the load capacitance connected to the output terminal OUT, and it is thought that this may lead to variation in delay time between the rising of the voltage level of the node N10 and the rising of the voltage level of the node N9. However, in the circuit of FIG. 26, the delay time is not influenced by the load capacitance, and held constant by the delay circuit. Therefore, destabilization of the operation due to occurrence of variation in rising speed of the output terminal OUT caused by the state of the load capacitance is prevented. Namely, a stable high-speed operation becomes possible.

SECOND MODIFIED EXAMPLE

Figure 27:
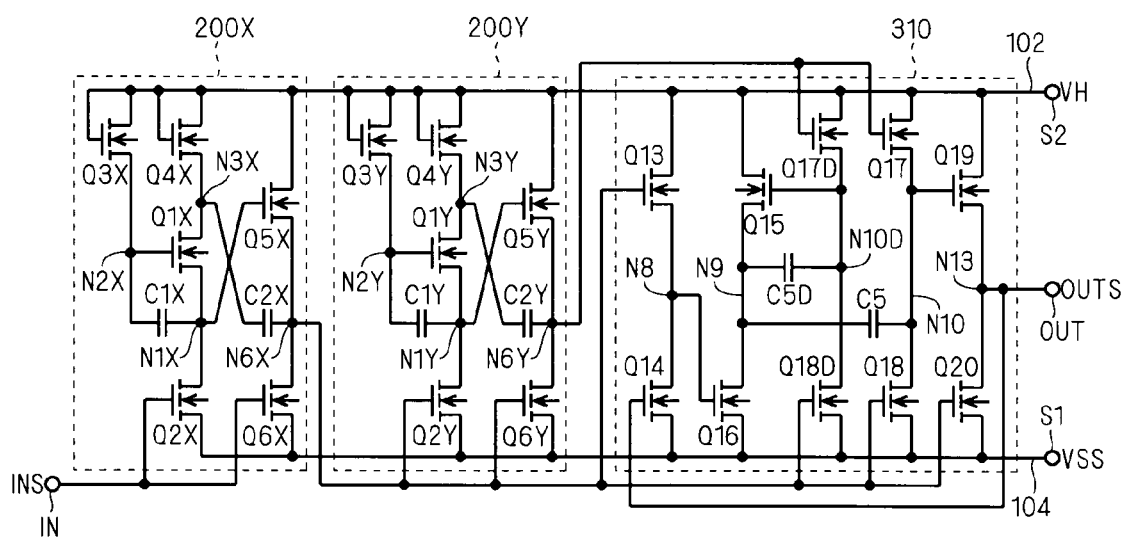
FIG. 27 is a circuit diagram showing a second modified example of the driver circuit according to Embodiment 5.

FIG. 27 is a circuit diagram of a driver circuit according to a second modified example of Embodiment 5. The driver circuit is formed by dividing the gate of the transistor Q15 and the gate of the transistor Q19 in the output stage circuit 310 under the circuit of FIG. 24. Namely, separately from the transistors Q17, Q18 that charge/discharge the gate (node N10) of the transistor Q19, transistors Q17D, Q18D that charge/discharge the gate (node N10D) of the transistor Q15 are provided. Further, separately from the capacitive element C5 between the nodes N9, N10, the capacitive element C5D is connected between the node N9 and the node N10D.

The transistors Q17D, Q18D are serial-connected between the high-side power line 102 and the low-side power line 104. A gate of the transistor Q17D is connected to the node N6Y of the input stage circuit 200Y along with the gate of the transistor Q17, and a gate of the transistor Q18D is connected to the node N6X of the input stage circuit 200X along with a gate of the transistor Q18. Namely, the transistors Q17D, Q18D respectively operate in similar manners to the transistors Q17, Q18. Therefore, in the circuit of FIG. 27, the circuit for controlling the gate voltage of the transistor Q15 is different from in the circuit of FIG. 24, but the operations are almost the same as in the circuit of FIG. 24.

In the circuit of FIG. 27, a parasitic capacitance of a node connected with the gate of the transistor Q15 is small as compared with the circuit of FIG. 24 by an amount corresponding to the gate capacitance of the transistor Q19. Hence, in charging of the node N9, the gate voltage of the transistor Q15 is raised higher due to the coupling through the capacitive element C5D. Therefore, at that time, the on-resistance of the transistor Q15 becomes smaller, to accelerate the rising of the voltage level of the node N9. This can result in an increase in step-up speed of the node N10 (gate of the transistor Q19) due to the coupling through the capacitive element C5, thereby to obtain the effect of increasing the rising speed of the output signal OUTS. However, it is necessary to note that the footprint becomes larger than the circuit of FIG. 24.

THIRD MODIFIED EXAMPLE

Although the driver circuits were shown in FIGS. 24 to 27, each of which generates the output signal (OUTS) at the same logic level (of the same phase) as the input signal (INS), the present embodiment is also applicable to a driver circuit that generates an output signal (of the opposite phase (/OUTS) obtained by reversing the logic level of the input signal INS, as in Embodiment 1. Here, such a modified example is shown.

FIG. 28 is a circuit diagram showing a configuration of a driver circuit according to a third modified example of Embodiment 5. In the driver circuit, the input signal INS is inputted into the input node of the input stage circuit 200Y, and the signal of the node N6Y of the input stage circuit 200Y is inputted into the input node of the input stage circuit 200X. Namely, in the present modified example, the input stage circuit 200Y is driven by the input signal INS, and the input stage circuit 200X is driven by the signal of the node N6Y of the input stage circuit 200Y. That is, in the input stage circuits 200X, 200Y, the side to drive and the side to be driven have been interchanged with each other as compared with the case of FIG. 24. In other words, in the present modified example, the signal of the node N6Y becomes the first internal signal, and the signal of the node N6X becomes the second internal signal.

However, the connecting relation among the input stage circuits 200X, 200Y, and the output stage circuit 310 is similar to that in FIG. 24. Namely, the signal of the node N6X of the input stage circuit 200X is inputted into the gates of the transistors Q13, Q18, Q20 of the output stage circuit 310, and the signal of the node N6Y of the input stage circuit 200Y is inputted into the gate of the transistor Q17.

According to the configuration of FIG. 28, the signal of the node N1Y of the input stage circuit 200Y is at the opposite logic level to the input signal INS, and the signal of the node N6X of the input stage circuit 200X is at the same logic level as the input signal INS. Therefore, the logic operations of the output stage circuit 310 are respectively opposite to those in the case of FIG. 24. Therefore, the output signal/OUTS that takes the opposite logic level to the logic level of the input signal INS is outputted from the output terminal OUT.

It should be noted that, although an example was shown in FIG. 28 where the relation of the input stage circuit 200X, 200Y is interchanged with that of the circuit of FIG. 24, the present modified example is also applicable to the circuits of FIGS. 25 to 28.

Embodiment 6

In Embodiment 6, described is a driver circuit according to the present invention, formed by constituting a driver circuit having a similar function to Embodiment 5 by the use of p-type transistors.

FIG. 29 is a diagram showing a configuration of the driver circuit according to Embodiment 2. The driver circuit is an example of realizing a circuit that functions in a manner similar to the circuit of FIG. 24 by the use of p-type transistors. Namely, the circuit of FIG. 29 is formed in the circuit of FIG. 24 by using p-type transistors in place of the n-type transistors, reversing the polarities of the power voltages (a high-side power voltage VLB is supplied to the low-side power line 102 and a low-side power voltage VHB is supplied to the high-side power line 104 in FIG. 24), and reversing the voltage polarity of each signal (the active level is made the L-level and the non-active level is made the H-level). It is to be noted that in FIG. 29, each element corresponding to that shown in the driver circuit of FIG. 24 is provided with the same reference with a letter "B" added thereto.

FIG. 29 is a diagram showing a configuration of a driver circuit according to Embodiment 6. The driver circuit is made up of the two input stage circuits 200XB, 200YB and an output stage circuit 310B. The input stage circuits 200XB, 200YB are respectively the same as those of Embodiment 4. Namely, those circuits have the same configurations as in Embodiment 2 and its modified examples (the driver circuit obtained by the similar driver circuit of Embodiment 1 by the use of the p-type transistors).

In the present embodiment, the input signal INSB is inputted into the input node of the input stage circuit 200XB, and the signal (first internal signal) of the node N6XB of the input stage circuit 200X is inputted into the input node of the input stage circuit 200YB. Namely, the input stage circuit 200XB is driven by the input signal INSB, and the input stage circuit 200YB is driven by the signal of the node N6XB of the input stage circuit 200XB.

Since the input stage circuits 200XB, 200YB respectively function as inverters for outputting signals obtained by reversing the respective logic levels of signals of the input nodes thereof, an output signal of the input stage circuit 200XB (signal of the node N6X) of FIG. 29 is set at an opposite logic level to the input signal INSB, and an output signal of the input stage circuit 200YB [signal of the node N6YB (second internal signal)] is set at the further opposite logic level thereto, namely the same logic level as the input signal INSB. However, due to a signal delay in the input stage circuit 200YB, the level change of the output signal of the input stage circuit 200YB occurs after a slight delay from the level change of the input stage circuit 200XB.

The output stage circuit 310B is a low-power ratioless-type driver with high driving ability. The output stage circuit 310B is made up of p-type transistors Q13B to Q20B and a capacitive element C5B. The transistors Q13B, Q14B are serial-connected between the low-side power line 102B and the high-side power line 104B. When a connection node between the transistors Q13B, Q14B is defined as a node N8B, a gate of the transistor Q13B connected between the low-side power line 102B and the node N8B is connected to the node N6XB of the input stage circuit 200XB. Further, a gate of the transistor Q14B connected between the node N8B and the high-side power line 104B is connected to the output terminal OUTB (node N13) of the driver circuit. Namely, the transistor Q13B serves to discharge electric charge of the node N8B to the low-side power line 102B in accordance with a voltage level of the node N6XB (output signal of the input stage circuit 200XB), and the transistor Q14B serves to charge the node N8B with a current from the high-side power line 104B in accordance with a voltage level of the output terminal OUTB (output signal OUTSB).

The transistors Q17B, Q18B are also serial-connected between the low-side power line 102B and the high-side power line 104B. When a connection node between the transistors Q17B, Q18B is defined as a node N10B, a gate of the transistor Q17B connected between the low-side power line 102B and the node N10B is connected to the node N6YB of the input stage circuit 200YB. Namely, the transistor Q17B serves to discharge electric charge of the node N10B to the low-side power line 102B in accordance with a voltage level of the node N6YB (output signal of the input stage circuit 200YB). On the other hand, a gate of the transistor Q18B connected between the node N10B and the high-side power line 104B is connected to the node N6XB of the input stage circuit 200XB. Namely, the transistor Q18B serves to charge the node N10B with a current from the high-side power line 104B in accordance with the voltage level of the node N6XB.

Similarly, the transistors Q15B, Q16B are also serial-connected between the low-side power line 102B and the high-side power line 104B. When a connection node between the transistors Q15B, Q16B is defined as a node N9B, a gate of the transistor Q15B connected between the low-side power line 102B and the node N9B is connected to the node N10B, and a gate of the transistor Q16B connected between the node N9B and the high-side power line 104B is connected to the node N8B. Further, the capacitive element C5B is connected between the node N9B and the node N10B. Namely, the transistor Q15B serves to discharge electric charge of the node N9B to the low-side power line 102B in accordance with a voltage level of the node N10B, and the transistor Q16B serves to charge the node N9B with a current from the high-side power line 104B in accordance with the voltage level of the node N8B.

Further, the transistors Q19B, Q20B are also serial-connected between the low-side power line 102B and the high-side power line 104B. The connection node N13B between the transistors Q19B, Q20B is the output terminal OUTB of the driver circuit, and the output signal OUTSB is outputted therefrom. A gate of the transistor Q19B connected between the high-side power line 102B and the output terminal OUTB is connected to the node N10B, and a gate of the transistor Q20B connected between the output terminal OUTB and the high-side power line 104B is connected to the node N6XB of the input stage circuit 200XB. Namely, the transistor Q19B serves to discharge electric charge of the output terminal OUTB to the low-side power line 102B in accordance with a voltage level of the node N10B, and the transistor Q20B serves to charge the node N9B with a current from the high-side power line 104B in accordance with the voltage level of the node N6XB.

In the output stage circuit 310B, as its operation is detailed below, a through current path from the low-side power line 102B to the high-side power line 104B is shut down through the use of a delay in voltage change of each node, and current consumption is thereby suppressed. Further, due to the operation of the output stage circuit 310B, the output signal OUTSB accurately changes between the voltages VLB and VHB.

Figure 30:
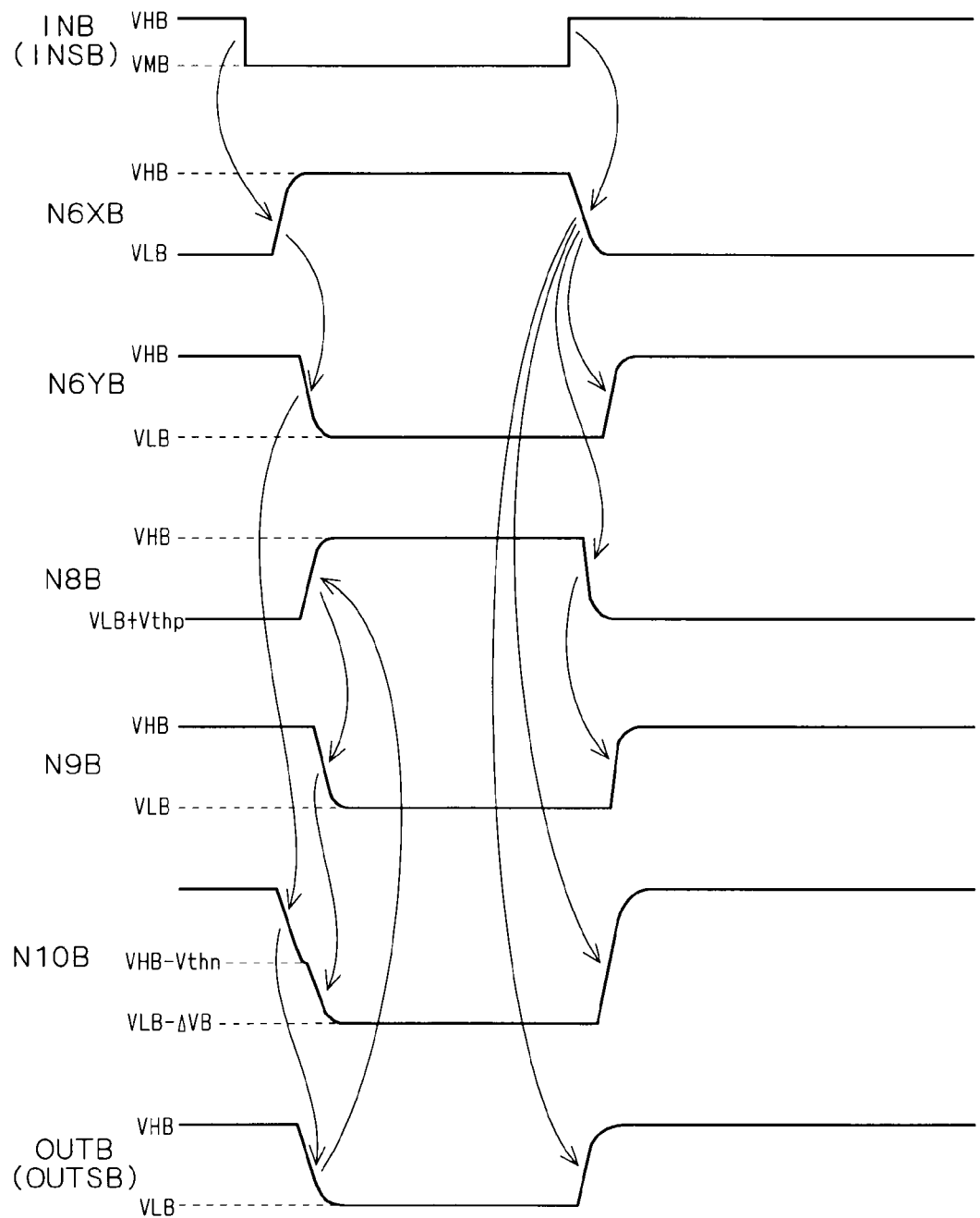
FIG. 30 is a signal waveform diagram showing an operation of the driver circuit according to Embodiment 6.

FIG. 30 is a signal waveform diagram showing an operation of the driver circuit (FIG. 29) according to the present embodiment. In the following, the operation of the driver circuit is described with reference to FIG. 30.

First, as an initial state, a state where the input signal INSB to be supplied to the input terminal INS is at the H-level of the voltage VHB is assumed. The node N6XB of the input stage circuit 200XB is at the L-level (VLB), and the node N6YB of the input stage circuit 200YB is at the H-Level (VHB). Therefore, the transistors Q13B, Q18B, Q20B of the output stage circuit 310B are in the on-state, and the transistor Q17B is in the off-state. Thus, the node N10B is at the H-Level (VHB), and the transistors Q15B, Q19B are in the off-state. Hence the output terminal OUTB is at the H-Level (VHB), and the transistor Q14B is in the off-state. Since the node N8B is at the L-level (VLB+Vthp) and the transistor Q16B is in the on-state, the node N9B is at the H-level (VHS).

When the input signal INSB shifts from this initial state to the L-level of the voltage VMB, the node N6XB of the input stage circuit 200XB shifts to the H-level of the voltage VHB. Since the signal of the node N6XB is inputted into the input stage circuit 200YB, the node N6YB of the input stage circuit 200YB shifts to the L-level of the voltage VLB, following the shift of the node N6XB to the H-level.

Then, in the output stage circuit 310B, the following operation is performed. First, when the node N6XB of the input stage circuit 200XB shifts to the H-Level (VHB), the transistors Q13B, Q18B, Q20B are turned off. At this time, the output terminal OUTB is still at the H-Level (VHB), and thereby, the transistor Q14B is also in the off-state. Therefore, even when the transistor Q13B is turned off, the node N8B is in a floating state, and held at the L-level of the VLB+Vthp.

Further, since the node N6YB of the input stage circuit 200YB shifts to the L-level (VLB), the transistor Q17B is turned on, to discharge the node N10B, and its voltage level falls. As thus described, the voltage change of the node N6YB occurs in accordance with the voltage change of the node N6XB, in discharging of the node N10B, the transistor Q18B is turned off before the transistor Q17B is turned on. This prevents generation of a through current passing through transistors Q17B, Q18B as its paths Although the node N10B is capacitively coupled with the node N9B through the capacitive element C5B, since the node N8B is held at the L-level and the transistor Q16B is in the on-state at this time, the node N9B is held at the H-level of almost the voltage VHB even when the voltage level of the node N10B falls. Further, when the discharging of the node N10B proceeds and a voltage between the nodes N10B, N9B exceeds a threshold voltage of the transistor Q15B, the transistor Q15B is turned on, but an on-resistance of the transistor Q15B is set sufficiently larger than that of the transistor Q16B, and also at this time, the node N9B is held at the H-level of almost the voltage VHB. As a consequence, the node N10B shifts to the L-level of the voltage VLB+Vthp.

When the node N10B shifts to the L-level (VLB+Vthp), the transistor Q19B is turned on, the output terminal OUTB is discharged, and its voltage level falls. Even at this time of discharging the output terminal OUTB, the transistor Q20B is turned off before the transistor Q19B is turned on. This prevents generation of a through current passing through the transistors Q19B, Q20B as its paths.

When the discharging of the output terminal OUTB proceeds, the transistor Q14B is turned on, and the node N8B is charged to shift to the H-Level (VHB). Since the transistor Q16B is turned off accordingly, the node N9B is discharged through the transistor Q15B, and the voltage level falls. Since this fall of the voltage level of the node N9B is transmitted to the node N10B through the capacitive element C5B, the voltage level of the node N10B also falls. When the voltage level of the node N10B falls, the transistor Q17B comes into the off-state and the node N10B comes into a floating state, and thereby, the voltage level of the node N10B further falls, to be a voltage VLB+ΔVA higher than the voltage VLB (ΔVA is determined by a voltage change amount of the node N9B and a ratio of a parasitic capacitance attached to the node N10B and a capacitance value of the capacitive element C5B.)

As thus described, when the transistor Q19B is turned on to activate the output signal OUTSB, the circuit made up of the transistors Q13B to Q16B lowers the voltage level of the node N9B, to lower the voltage level of the node N10B. Thereby, a gate-source voltage of the transistor Q19B is raised. Namely, the circuit made up of the transistors Q13B to Q16B constitutes a step-up circuit that operates based upon the output signal OUTSB, and raises the gate-source voltage of the transistor Q19B in activation of the output signal OUTSB.

As thus described, in the output stage circuit 310B, when the voltage level of the output terminal OUTB falls by the transistor Q19 discharging the output terminal OUTB, the bootstrap effect of feeding back the fall of the voltage to the node N10B (gate of the transistor Q19B) is obtained. This leads to the fall of the voltage level of the node N10B, whereby the transistor Q19 has increased current driving force, and performs a non-saturated operation. Accordingly, the output terminal OUTB is discharged at high speed, to shift to the L-level of VLB.

It is to be noted that, since the transistor Q15B also performs the non-saturated operation at this time, the voltage level of the node N9B becomes VLB. As thus described, the transistor Q15B is turned on upon charging of the node N10B, and the transistor Q16B is turned off thereafter by charging of the node N8B. Namely, the transistor Q15B is turned on before the transistor Q16B is turned off, and hence during that time, a through current flows through the transistors Q15B, Q16B. However, making current driving force of the transistors Q15B, Q16B sufficiently small can prevent an increase in power consumption.

Further, the period during which the through current is generated is only a short period from turning-on of the transistor Q19B along with the transistor Q15B to discharging of the output terminal OUTB to shift to the L-level. The larger the current driving force of the transistor Q19B, the shorter the period can be made and the smaller the power consumption due to the through current can be made. Especially when a load capacitance applied to the output terminal OUTB is large, the current driving force of the transistor Q19B is desirably set sufficiently large in order to prevent the output terminal OUTB from taking time for discharging. Since the output stage circuit 310B is the ratioless-type circuit, and a through current is not generated therein in a steady state, even when the current driving force of the transistor Q19B is set large, it does not involve an increase in power consumption in the steady state.

With reference to FIGS. 29 and 30 again, when the input signal INSB shifts from the L-level (VMB) to the H-level (VHB), the node N6X of the input stage circuit 200XB shifts to the L-level of the voltage VLB. Further, accordingly, the node N6YB of the input stage circuit 200YB shifts to the H-Level (VHB).

At this time, in the output stage circuit 310B, the transistors Q18B, Q20B are turned on with the node N6XB having shifted to the L-level, and the transistor Q17B is turned off with the node N6YB having shifted to the H-level. Hence the node N10B and the output terminal OUTB are charged. Since the transistors Q19B, Q15B are turned off when the node N10B shifts to the H-level, the output signal OUTSB shifts to the H-level of the voltage VHB.

Further, since the transistor Q13B has already been turned on at the time of shifting of the node N6XB to the L-level, the output terminal OUTB shifts to the H-level, and when the transistor Q14B is turned off, the node N8B is discharged to shift to the L-level of the voltage VLB+Vthp. Accordingly, the transistor Q16B is turned on, and the node N9B shifts to the H-level of the voltage VHB.

In this discharging of the node N8B, the transistor Q13B is turned on before the transistor Q14B is turned off, and hence a through current flows through the transistors Q13B, Q14B during the time period from turning-on of the transistor Q13B to turning-off of the transistor Q14B. However, since the output terminal OUTB is charged at high speed to shift to the H-Level (VHB), that time period is very short and the amount of the through current is just a tiny amount. Further, in charging of the node N9B, the transistor Q15B is turned off before the transistor Q16B is turned on, and hence a through current is not generated through the transistors Q15B, Q16B.

By the operations as thus described, the driver circuit returns to the above-mentioned initial state. Thereafter, the operations described above are repeated in accordance with the level change of the input signal INSB.

It is to be noted that in the steady state, the through current path from the low-side power line 102B to the high-side power line 104B does not exist in the output stage circuit 310B. Therefore, the driving abilities of the transistors Q19B, Q20B can be set large, so as to charge/discharge the output terminal OUTB at high speed to change the level of the output signal OUTSB at high speed even in the case of a large output load capacitance of the output terminal OUTB.

In the circuit of FIG. 29, the input stage circuit 200XB drives the transistors Q2YB, Q6YB, Q13B, Q18B, Q20B, and the drive stage 200YB drives the transistor Q17B. Typically, a gate capacitance value of each of these transistors is an order of magnitude small as compares with a capacitance value of a load capacitance connected to the output terminal OUTB, individual driving abilities of the input stage circuits 200XB, 200YB may be an order of magnitude small as compared with the driving ability of the output stage circuit 310B. Namely, in the present embodiment, the power consumption of the input stage circuits 200XB, 200YB including the ratio-type circuit can be set extremely smaller than in the driver circuit of Embodiment 2.

As thus described, in the driver circuit of the present embodiment, based upon the output signals of the input stage circuits 200XB, 200YB (signals of the node N6XB, 6Y) which consume extremely lower power than the driver circuit of Embodiment 2, the output stage circuit 310B as the low-power ratioless-type bootstrap circuit is driven, to generate the output signal OUTSB. Since the through current is not generated in the output stage circuit 310B in the steady state, driving power is not restricted for suppressing the through current, and hence its driving ability can be set high. It is thus possible to realize a low-power driver circuit with high driving ability.

MODIFIED EXAMPLE

Although the example was shown above where the driver circuit having a similar function to the circuit of FIG. 24 was configured using the p-type transistors, the present embodiment is also applicable to the circuits of the respective modified examples (FIGS. 26 to 28) of Embodiment 5.

Namely, in the circuits of FIGS. 26 to 28, p-type transistors are used in place of the n-type transistors, the polarities of the power voltages are reversed (the low-side power voltage VLB is supplied to the high-side power line 102 and the high-side power voltage VHB is supplied to the low-side power line 104 in each figure), and the voltage polarity of each signal is reversed (the active level is made the L-level and the non-active level is made the H-level), so that driver circuit having similar functions to those circuits can be configured using p-type transistors (this case is not shown).

While the invention has been shown and described in detail, the foregoing description is in all aspects illustrative and not restrictive. It is therefore understood that numerous modifications and variations can be devised without departing from the scope of the invention.

What is claimed is:

1. A driver circuit that changes a voltage level of an output signal in correspondence with a change in voltage level of an input signal, said driver circuit comprising:
   a first power source and a second power source;
   an input terminal, which receives said input signal;
   an output terminal, from which said output signal is outputted;
   a first transistor of a predetermined conductive type, which is connected between said first power source and a predetermined first node, and has a gate connected to said input terminal;
   a second transistor of said predetermined conductive type, which is connected between said first node and a predetermined second node;
   a first unilateral current driving element, one end of which is connected to a third node connected with a gate of said second transistor, and which supplies the third node with a voltage for bringing said second transistor into an on-state;
   a second unilateral current driving element, one end of which is connected to said second node;
   a first capacitive element, which is connected between said first node and said third node;
   a third transistor of said predetermined conductive type, which is connected between said first power source and said output terminal, and has a gate connected to said input terminal;
   a fourth transistor of said predetermined conductive type, which is connected between said second power source or a voltage generating circuit for generating an active-level voltage and said output terminal; and
   a push-pull circuit, which transmits a voltage signal of said first node to a gate of said fourth transistor, wherein
   a pull-up transistor that shifts said gate of said fourth transistor to the active level in said push-pull circuit has a higher driving ability than said second transistor,
   said second unilateral current driving element previously supplies said second node with a predetermined voltage such that a voltage for turning on said fourth transistor is supplied to said first node through said second transistor when said first transistor is turned off, and
   said driver circuit is configured such that a voltage change of said second node occurs in correspondence with a voltage change of said output terminal when said fourth transistor is turned on, and a gate-source voltage of said fourth transistor is further increased due to a voltage change of said first node caused by said voltage change of said second node.

2. The driver circuit according to claim 1, wherein a second capacitive element is connected between an output node of said push-pull circuit and said second node.

3. The driver circuit according to claim 1, wherein said first unilateral current driving element is a diode-connected seventh transistor of said predetermined conductive type.

4. The driver circuit according to claim 3, wherein said seventh transistor is connected between said third node and said second power source.

5. The driver circuit according to claim 1, wherein said second unilateral current driving element is a diode-connected eighth transistor of said predetermined conductive type.

6. The driver circuit according to claim 5, wherein said eighth transistor is connected between said second node and said second power source.

7. The driver circuit according to claim 1, wherein
said second unilateral current driving element is an eighth transistor connected between said second node and said second power source, and
a gate of said eighth transistor is supplied with a constant voltage corresponding to a sum of a voltage of said second power source and a threshold voltage of said eighth transistor.

8. The driver circuit according to claim 7, wherein
said first unilateral current driving element is a seventh transistor connected between said third node and said second power source, and
a gate of said seventh transistor is connected to the gate of said eighth transistor.

9. The driver circuit according to claim 1, wherein said push-pull circuit is a multistage push-pull circuit in which a driving ability becomes higher in a more subsequent stage.

10. The driver circuit according to claim 1, wherein in said push-pull circuit, an output voltage of said voltage generating circuit is used as a power source.

11. A driver circuit that changes a voltage level of an output signal in correspondence with a change in voltage level of an input signal, said driver circuit comprising:
a first power source and a second power source;
an input terminal, which receives said input signal;
an output terminal, from which said output signal is outputted;
a first transistor of a predetermined conductive type, which is connected between said first power source and a predetermined first node, and has a gate connected to said input terminal;
a second transistor of said predetermined conductive type, which is connected between said first node and a predetermined second node;
a first unilateral current driving element, one end of which is connected to a third node connected with a gate of said second transistor, and which supplies said third node with a voltage for bringing said second transistor into an on-state;
a second unilateral current driving element, one end of which is connected to said second node;
a first capacitive element, which is connected between said first node and said third node;
a third transistor of said predetermined conductive type, which is connected between said first power source and said output terminal, and has a gate connected to said input terminal;
a fourth transistor of said predetermined conductive type, which is connected between said second power source or a voltage generating circuit for generating an active-level voltage and said output terminal;
a fifth transistor of said predetermined conductive type, which is connected between said first power source and a predetermined fourth node, and has a gate connected to a gate of said third transistor;
a sixth transistor of said predetermined conductive type, which is connected between said second power source or said voltage generating circuit and said fourth node, and has a gate connected to a gate of said fourth transistor; and
a push-pull circuit, which transmits a voltage signal of said first node to the gate of said fourth transistor, wherein
a pull-up transistor that shifts the gate of said fourth transistor to the active level in said push-pull circuit has a higher driving ability than said second transistor,
said second unilateral current driving element previously supplies said second node with a predetermined voltage such that a voltage for turning on said fourth and sixth transistors is supplied to said first node through said second transistor when said first transistor is turned off, and
said driver circuit is configured such that a voltage change of said second node occurs in correspondence with a voltage change of said fourth node when said fourth and sixth transistors are turned on, and gate-source voltages of said fourth and sixth transistors are further increased due to a voltage change of said first node caused by said voltage change of said second node.

12. The driver circuit according to claim 11, wherein a second capacitive element is connected between an output node of said push-pull circuit and said second node.

13. The driver circuit according to claim 11, wherein said first unilateral current driving element is a diode-connected seventh transistor of said predetermined conductive type.

14. The driver circuit according to claim 13, wherein said seventh transistor is connected between said third node and said second power source.

15. The driver circuit according to claim 11, wherein said second unilateral current driving element is a diode-connected eighth transistor of said predetermined conductive type.

16. The driver circuit according to claim 15, wherein said eighth transistor is connected between said second node and said second power source.

17. The driver circuit according to claim 11, wherein
said second unilateral current driving element is an eighth transistor connected between said second node and said second power source, and
a gate of said eighth transistor is supplied with a constant voltage corresponding to a sum of a voltage of said second power source and a threshold voltage of said eighth transistor.

18. The driver circuit according to claim 17, wherein
said first unilateral current driving element is a seventh transistor connected between said third node and said second power source, and
a gate of said seventh transistor is connected to the gate of said eighth transistor.

19. The driver circuit according to claim 11, wherein said push-pull circuit is a multistage push-pull circuit in which a driving ability becomes higher in a more subsequent stage.

20. The driver circuit according to claim 11, wherein in said push-pull circuit, an output voltage of said voltage generating circuit is used as a power source.

21. The driver circuit according to claim 11, wherein
a third unilateral current driving element is interposed between said second power source or said voltage generating circuit and said sixth transistor,
said third unilateral current driving element supplies a voltage corresponding to a voltage of said second power source or an output voltage of said voltage generating circuit to a fifth node as a connection node between the third unilateral current driving element and said sixth transistor, and
a third capacitive element is connected between said fifth node and said output terminal.

22. The driver circuit according to claim 11, wherein
- a third unilateral current driving element is interposed between said second power source or said voltage generating circuit and said sixth transistor,
- said third unilateral current driving element supplies a voltage corresponding to a voltage of said second power source or an output voltage of said voltage generating circuit to a fifth node as a connection node between said third unilateral current driving element and said sixth transistor, and
- said driver circuit further comprises:
- an eleventh transistor of said predetermined conductive type, which is connected between said first power source and a predetermined sixth node, and has a gate connected to said input terminal;
- a twelfth transistor of said predetermined conductive type, which is connected between said second power source or said voltage generating circuit and said sixth node, and has a gate connected to said gate of said fourth transistor; and
- a third capacitive element, which is connected between said fifth node and said sixth node.

23. A driver circuit that changes a voltage level of an output signal in correspondence with a change in voltage level of an input signal, said driver circuit comprising:
- an input terminal, which receives said input signal;
- an output terminal, from which said output signal is outputted;
- a first input stage circuit, which, upon receipt of said input signal, outputs a first internal signal at a voltage level that changes in correspondence with a change in voltage level of said input signal;
- a second input stage circuit, which, upon receipt of said first internal signal, outputs a second internal signal which takes a logic level obtained by reversing said first internal signal; and
- an output stage circuit, which operates based upon signals from said first and second input stage circuits, to generate said output signal, wherein
- each of said first and second input stage circuits constitutes the driver circuit according to claim 11.

24. The driver circuit according to claim 23, wherein
said output stage circuit includes:
- a thirteenth transistor of said predetermined conductive type, which is connected between said first power source and said output terminal, and has a gate that receives said second internal signal;
- a fourteenth transistor of said predetermined conductive type, which is connected between said second power source or said voltage generating circuit and said output terminal;
- a fifteenth transistor of said predetermined conductive type, which is connected between said first power source and a predetermined seventh node, and has gate that receives said second internal signal; and
- a sixteenth transistor of said predetermined conductive type, which is connected between said second power source or said voltage generating circuit and said seventh node, and has a gate connected to an eighth node connected with a gate of said fourteenth transistor,
- wherein said eighth node is supplied with a signal, supplied to a gate of said fourth transistor of said first input stage circuit, through a push-pull circuit.

25. The driver circuit according to claim 23, wherein
said output stage circuit includes:
- a thirteenth transistor of said predetermined conductive type, which is connected between said first power source and said output terminal, and has a gate that receives said first internal signal;
- a fourteenth transistor of said predetermined conductive type, which is connected between said second power source or said voltage generating circuit and said output terminal;
- a fifteenth transistor of said predetermined conductive type, which is connected between said first power source and a predetermined seventh node, and has gate that receives said first internal signal; and
- a sixteenth transistor of said predetermined conductive type, which is connected between said second power source or said voltage generating circuit and said seventh node, and has a gate connected to an eighth node connected with a gate of said fourteenth transistor,
- wherein said eighth node is supplied with a signal, supplied to a gate of said fourth transistor of said second input stage circuit, through a push-pull circuit.

26. The driver circuit according to claim 23, wherein said output stage circuit is a ratioless bootstrap-type driving circuit, which is driven by said first and second internal signals.

* * * * *